(12) United States Patent
Yamazaki et al.

(10) Patent No.: US 7,732,263 B2
(45) Date of Patent: Jun. 8, 2010

(54) SEMICONDUCTOR DEVICE

(75) Inventors: Shunpei Yamazaki, Setagaya (JP); Koji Dairiki, Isehara (JP)

(73) Assignee: Semiconductor Energy Laboratory Co., Ltd, Atsugi-shi, Kanagawa-ken ( * ) Notice: Subject to any disclaimer, the term of this patent is extended or adjusted under 35 U.S.C. 154(b) by 786 days.

(21) Appl. No.: 10/590,022

(22) PCT Filed: Feb. 21, 2005

(86) PCT No.: PCT/JP2005/003225

§ 371 (c)(1),
(2), (4) Date: Aug. 21, 2006

(87) PCT Pub. No.: WO2005/081303

PCT Pub. Date: Sep. 1, 2005

(65) Prior Publication Data

US 2007/0176234 A1    Aug. 2, 2007

(30) Foreign Application Priority Data

Feb. 25, 2004  (JP) .............................. 2004-050345

(51) Int. Cl.
*H01L 21/00* (2006.01)
*H01L 21/84* (2006.01)

(52) U.S. Cl. ............... 438/153; 438/166; 257/E21.413; 257/E21.415

(58) Field of Classification Search ................. 438/153, 438/166, 487, 585, 593; 257/E21.413, E21.415, 257/E21.134, E21.646
See application file for complete search history.

(56) References Cited

U.S. PATENT DOCUMENTS

| 5,529,951 A |   | 6/1996 | Noguchi et al. |
| 5,789,763 A |   | 8/1998 | Kato et al. |
| 5,856,788 A |   | 1/1999 | Walter et al. |
| 5,943,593 A |   | 8/1999 | Noguchi et al. |
| 5,981,974 A |   | 11/1999 | Makita |
| 6,072,559 A | * | 6/2000 | Kanemori et al. ........... 349/192 |

(Continued)

FOREIGN PATENT DOCUMENTS

| JP | 60-153156 | 8/1985 |
| JP | 2001-260580 | 9/2001 |
| JP | 2003-059831 | 2/2003 |
| WO | WO 97/34222 | 9/1997 |

OTHER PUBLICATIONS

International Search Report (Application No. PCT/JP2005/003225) dated Jun. 7, 2005.

(Continued)

*Primary Examiner*—Walter L Lindsay, Jr.
(74) *Attorney, Agent, or Firm*—Eric J. Robinson; Robinson Intellectual Property Law Office, P.C.

(57) ABSTRACT

The present invention is to provide a semiconductor device that achieves high mechanical strength without reducing the circuit scale and that can prevent the data from being forged and altered illegally while suppressing the cost. The present invention discloses a semiconductor device typified by an ID chip that is formed from a semiconductor thin film including a first region with high crystallinity and a second region with the crystallinity inferior to the first region. Specifically, a TFT (thin film transistor) of a circuit requiring high-speed operation is formed by using the first region and a memory element for an identifying ROM is formed by using the second region.

26 Claims, 21 Drawing Sheets

U.S. PATENT DOCUMENTS

| | | |
|---|---|---|
| 6,709,905 B2 | 3/2004 | Kusumoto et al. |
| 2003/0022403 A1* | 1/2003 | Shimoda et al. ............... 438/14 |
| 2003/0062845 A1* | 4/2003 | Yamazaki et al. ........ 315/169.3 |
| 2003/0160715 A1 | 8/2003 | Maeda et al. |
| 2004/0106237 A1 | 6/2004 | Yamazaki |

OTHER PUBLICATIONS

Written Opinion (Application No. PCT/JP2005/003225) dated Jun. 7, 2005.

* cited by examiner 550  551

553  552  541

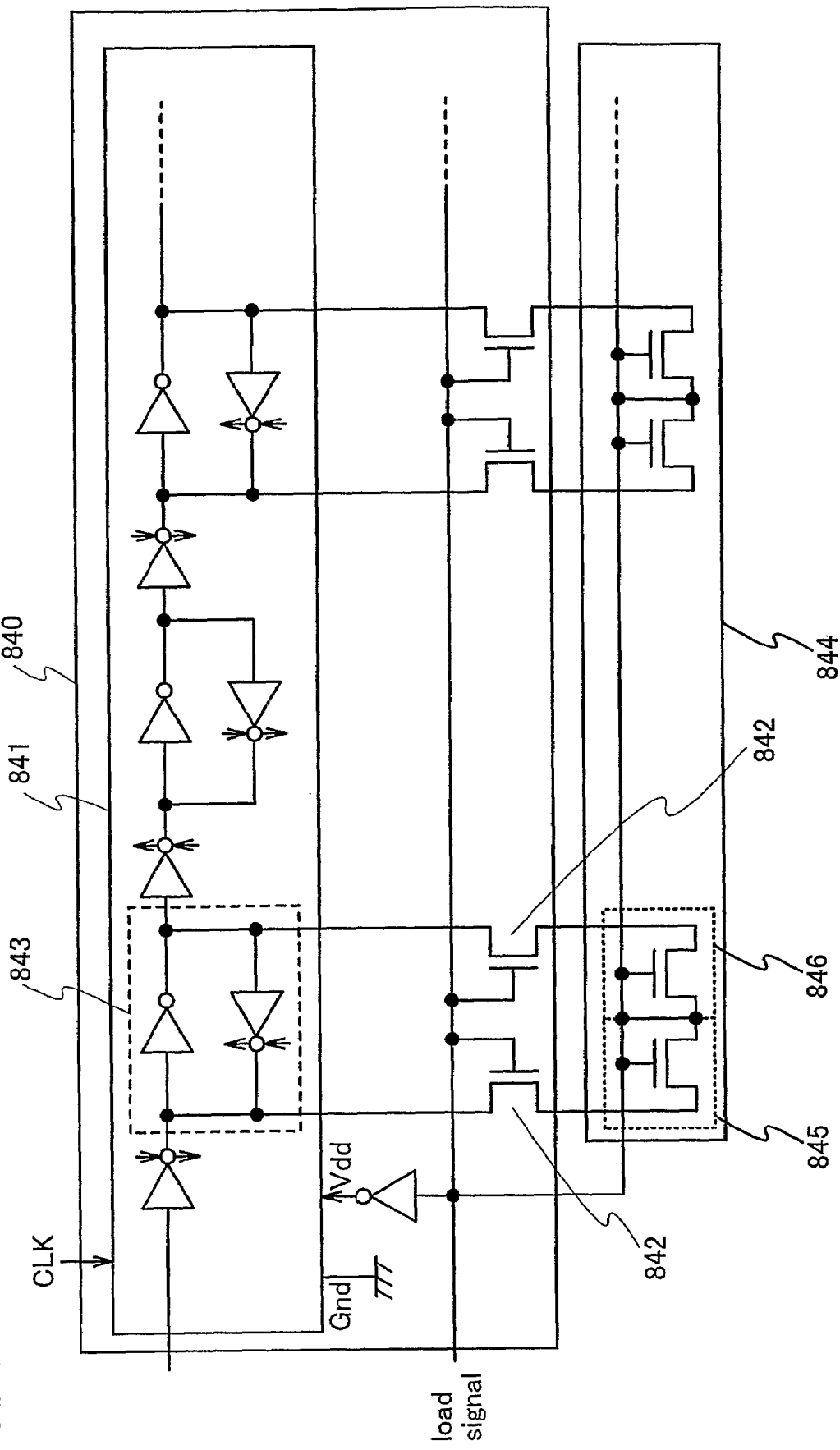

SEMICONDUCTOR DEVICE

TECHNICAL FIELD

The present invention relates to a semiconductor device capable of wireless communication.

BACKGROUND ART

A practical application of a semiconductor device typified by an ID chip being able to transmit data such as identification data wirelessly has been advanced in various fields. Moreover, a market of the semiconductor device as a new communication terminal is expected to expand. The ID chip is also called a wireless tag, an RFID (Radio Frequency Identification) tag, or an IC tag. The ID chip having an antenna and an integrated circuit formed using a semiconductor substrate is being put into practical use.

Compared to a magnetic card and a barcode from which the stored data can be read wirelessly, the ID chip has advantages that the stored data are in no danger of being read by physical means and that the data are hard to be altered. Moreover, the ID chip has another advantage that the ID chip is difficult to be forged because the ID chip requires a relatively large-scaled production facility unlike the magnetic card and the barcode.

For example, a patent document 1 discloses a method for preventing the illegal use of the securities, for allowing the reuse of the securities when the securities are returned to the legitimate administrator in the case of the securities lost or stolen, by mounting the IC chip on the securities.

[Patent Document] Japanese Patent Document Laid-Open No.: 2001-260580

DISCLOSURE OF INVENTION

When the forgery of the ID chip and the illegal alteration of the data stored in the ID chip can be prevented more surely, for example, forgery of an object with the ID chip provided can be prevented, and for example, deceptions of a production area, a producer, a channel of distribution, and the like can be prevented. However, with the advance of the technique of the forgery of the ID chip and the illegal alteration of the data, it has become uneasy to prevent the forgery and the deception and to arrest these.

When the integrated circuit in the ID chip includes a nonvolatile memory of which the data cannot be altered, the forgery of the ID chip can be prevented more surely compared to the case of simply using a rewritable memory. Among nonvolatile memories in which the data cannot be altered, for example, a mask ROM can be applied to the ID chip relatively easily without complicate processes. However, since the data stored in the integrated circuit includes an identification number and the like that are unique to the ID chip, a photomask for determining the unique data among photomasks used for forming the mask ROM is disposed, and accordingly the cost cannot be reduced.

In principle, since the ID chip can be made smaller than the magnetic card and the barcode, the versatility of the ID chip is expected to expand further. However, although the ID chip is expected to be provided to a flexible material such as paper or plastic as usage, the semiconductor substrate used as a base of the ID chip is inferior to the flexible material on mechanical strength. Therefore, when the ID chip is formed on a packing material, a tag, a bond, a bank note, securities, and the like that use flexible materials as a support medium, there is a risk that the ID chip may be destroyed in use, and the ID chip is not practical in these applications.

The mechanical strength of the ID chip can be improved to some extent by miniaturizing the ID chip. However, miniaturizing the ID chip is not preferable because it is difficult to secure the space for the circuit. When the space is not enough, the application of the ID chip is limited. Therefore, when the space required for forming the circuit is emphasized, the ID chip cannot be miniaturized, and the improvement of the mechanical strength of the ID chip has its limit.

In the case of the ID chip formed by using the semiconductor substrate, since the semiconductor substrate serves as a conductor to block electric waves, the signal of the electric wave is easily attenuated depending on the direction.

In view of the above problem, it is an object of the present invention to provide a semiconductor device being able to prevent the forgery and the illegal alteration of the data while reducing the cost and to improve the mechanical strength without miniaturizing the circuit scale of the integrated circuit.

A semiconductor device of the present invention typified by an ID chip uses a thin semiconductor film including a first region having high crystallinity and a second region having inferior crystallinity to that of the first region. Specifically, a thin film transistor (TFT) of a circuit in which a high-speed operation is required is formed by using the first region, and a memory element for an identification ROM is formed by using the second region.

The first region and the second region can be formed by crystallization using, for example, a continuous wave laser. Unlike a pulsed laser, the crystal grown continuously toward the scanning direction can be formed by irradiating a semiconductor film with the continuous wave laser while scanning the laser beam in one direction. Thus, the first region having an aggregation of crystal grains extending in the scanning direction can be formed. When the aggregations of the crystal grains each of which extends in the scanning direction are used as active layers of the TFTs, it is possible to form TFTs having relatively uniform characteristic and having few crystal grain boundaries that cross the direction in which the carrier moves.

In the case of using the continuous wave laser, the second region is formed in opposite ends of the beam spot in the direction perpendicular to the scanning direction. The second region has inferior crystallinity in which the crystal grain is much smaller than that in the center of the beam spot. In the present invention, the characteristics of memory elements are made to vary by forming the memory elements daringly in the second region having inferior crystallinity among the semiconductor film crystallized by the laser. Since the variation of the characteristics between the memory elements depends on the variation of the crystallinity, the former variation can be produced randomly even when the same circuit structure, the same layout, and the same manufacturing process are applied. Therefore, by using the variation of the characteristics between the memory elements as the data, a nonvolatile memory with the unique data stored can be formed. In this specification, a ROM using the variation of the characteristics of memory elements is hereinafter referred to as a random ROM.

The integrated circuit may be formed over a substrate or may be pasted to a flexible substrate after being formed over the substrate. The ID chip of the present invention may have an antenna in addition to the integrated circuit. The integrated circuit can be operated with the use of an alternating voltage generated by in the antenna and can send a signal to a reader/writer by modulating the alternating voltage applied to the antenna. The antenna may be formed together with the integrated circuit. Alternatively, the antenna may be formed separately from the integrated circuit and then connected electrically with the integrated circuit. The ID chip with the antenna mounted is also referred to as an RF (Radio Frequency) chip.

There are some methods for pasting the integrated circuit. One is that a metal oxide film is formed between the substrate having high resistance against the heat and the integrated circuit, and the integrated circuit is stripped by weakening the metal oxide film through crystallization and pasted. Another is that a stripping layer is provided between the substrate having high resistance against the heat and the integrated circuit, and then the integrated circuit is stripped from the substrate by removing the stripping layer through etching and pasted. Another is that the hard substrate having high resistance against the heat with the integrated circuit formed thereover is mechanically removed or etched by using solution or gas so that the hard substrate is removed and the integrated circuit is stripped therefrom and pasted. Any other methods can be also applied.

The circuit scale and the capacity of memory may be increased in such a way that the integrated circuits each of which is formed separately are laminated by being pasted each other. Since the integrated circuit is considerably thinner than the ID chip manufactured by using the semiconductor substrate, the mechanical strength of the ID chip can be kept to some extent even when a plurality of integrated circuits are laminated. The laminated integrated circuits can be connected by a known method such as a flip chip method, a TAB (Tape Automated Bonding) method, or a wire bonding method.

Since the circuit structure and the layout may be the same between the ID chips in the present invention, it is not necessary to dispose the photomask by every ID chip differently from the mask ROM. Therefore, the cost for manufacturing the ID chip can be suppressed. Moreover, when the nonvolatile memory such as a flash memory except the mask ROM is manufactured, it is difficult to reduce the cost because the number of manufacturing steps needs to be increased. However, in the case of using the TFT as the memory element of the random ROM, the TFT used as the memory element can be manufactured by the same process as that for forming the TFT used in another integrated circuit of the ID chip. Therefore, it is possible to prevent the forgery of the ID chip and the illegal alteration of the data while preventing the increase of the cost for manufacturing the random ROM.

In the case of using the mask ROM, there is a risk that the identification number is read by analyzing the circuit layout. However, since the random ROM can be formed by the same circuit structure, layout, and manufacturing process, it is possible to prevent the data from being read by any other methods than the electrical reading of the data.

Since the integrated circuit of the ID chip is formed of electrically isolated TFTs, the flexible substrate can be used. In this case, high mechanical strength can be obtained without making the ID chip as small as that formed by using the semiconductor substrate. Therefore, it is possible to increase the mechanical strength of the ID chip without miniaturizing the circuit scale and to expand the versatility of the ID chip further.

Since the integrated circuit of the ID chip of the present invention is formed of the electrically isolated TFTs, a parasitic diode is hardly formed between the integrated circuit and the substrate unlike the transistor formed by using the semiconductor substrate. Therefore, a large amount of current is not flowed to the drain region by the electrical potential of the alternating signal given to the source region or the drain region, and the deterioration or the breakdown is hard to occur. Moreover, the ID chip of the present invention has advantages that the electric waves are not blocked so much as the case of the ID chip formed by using the semiconductor substrate and that attenuation of the signal due to the blocking of the electric waves can be suppressed.

BRIEF DESCRIPTION OF DRAWINGS

FIG. 11 is a drawing for showing structures of the memory cell array and a readout circuit in the random ROM;

BEST MODE FOR CARRYING OUT THE INVENTION

Embodiment mode and embodiments are hereinafter described with reference to drawings. However, since the present invention can be embodied in many different modes, it is understood that modes and details of the present invention can be changed unless such change will not depart from the scope and the content of the present invention. Therefore, the present invention is not limited to the description of the embodiment mode and the embodiments.

Figure 1A:
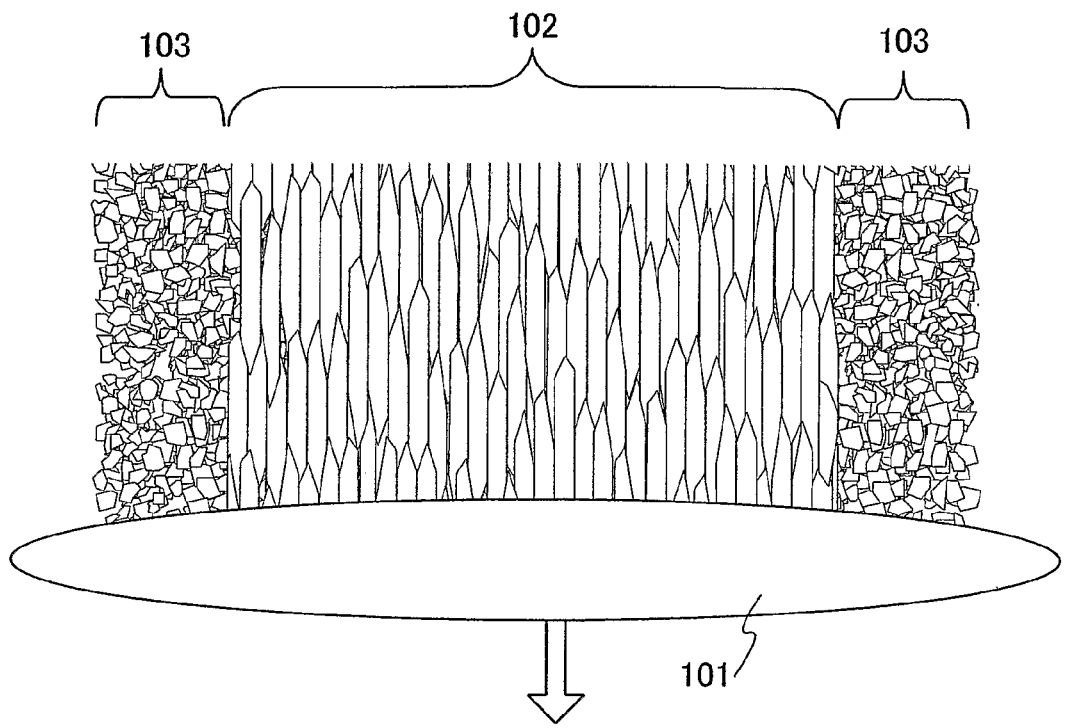
FIG. 1A is a top view of a laser beam spot and a crystallized semiconductor film.

First, a structure of a semiconductor film crystallized by a continuous wave laser is described with reference to FIG. 1A. In FIG. 1A, a reference numeral 101 denotes a beam spot of a laser beam. A beam spot 101 is scanned in a direction perpendicular to a direction of a major axis of the beam spot 101 as shown by a white arrow in FIG. 1A. The semiconductor film crystallized by the beam spot 101 has a first region 102 and a second region 103 according to the difference in the crystallinity.

In the first region 102 formed by the central region of the beam spot 101, the semiconductor film can be melted completely because the energy density of the laser beam is high. This region in which the semiconductor film melts completely moves continuously in the semiconductor film to the scanning direction by scanning the beam spot 101, and a large crystal grain grown continuously to the scanning direction is formed in this region. Specifically, a crystal grain having a width of 10 to 30 μm in the scanning direction and a width of 1 to 5 μm in a direction perpendicular to the scanning direction can be formed.

In the second region 103 formed by a portion adjacent to an edge of the beam spot 101, it is difficult to melt the semiconductor film completely because the energy density of the laser beam is low. Therefore, in the second region 103, unlike the first region 102, positions and sizes of the crystal grains are random, and the grain sizes are in the range of approximately 0.2 to several μm (microcrystal).

Figure 20A:
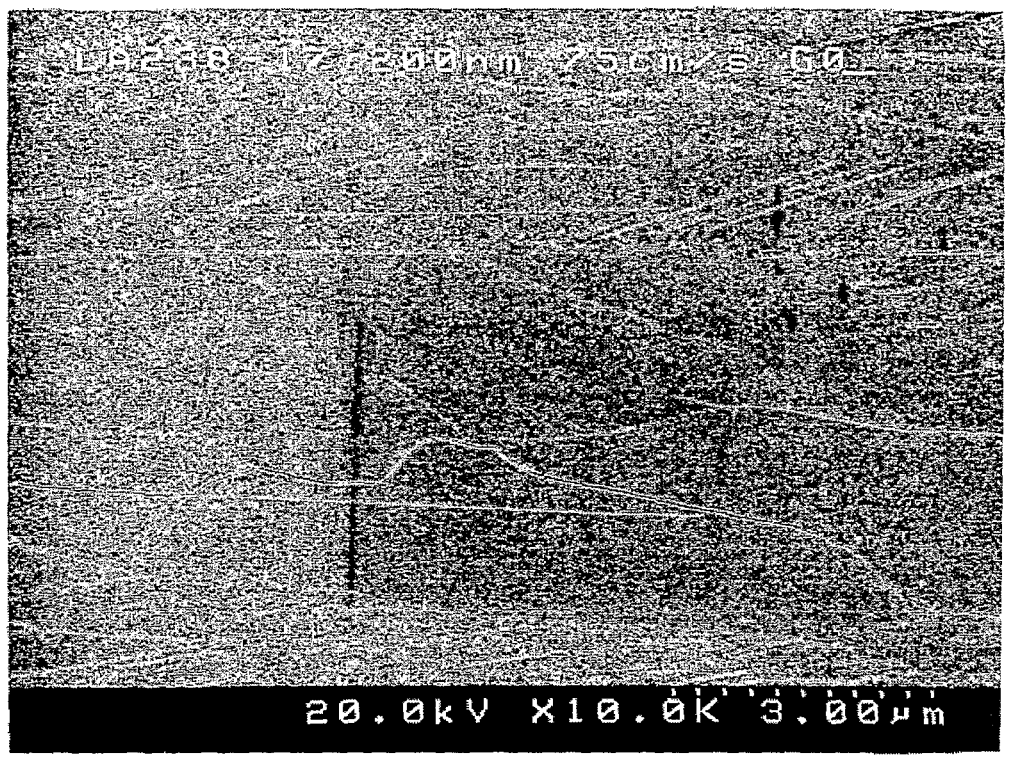
FIGS. 20A and 20B are SEM images of a first region.
Figure 20B:
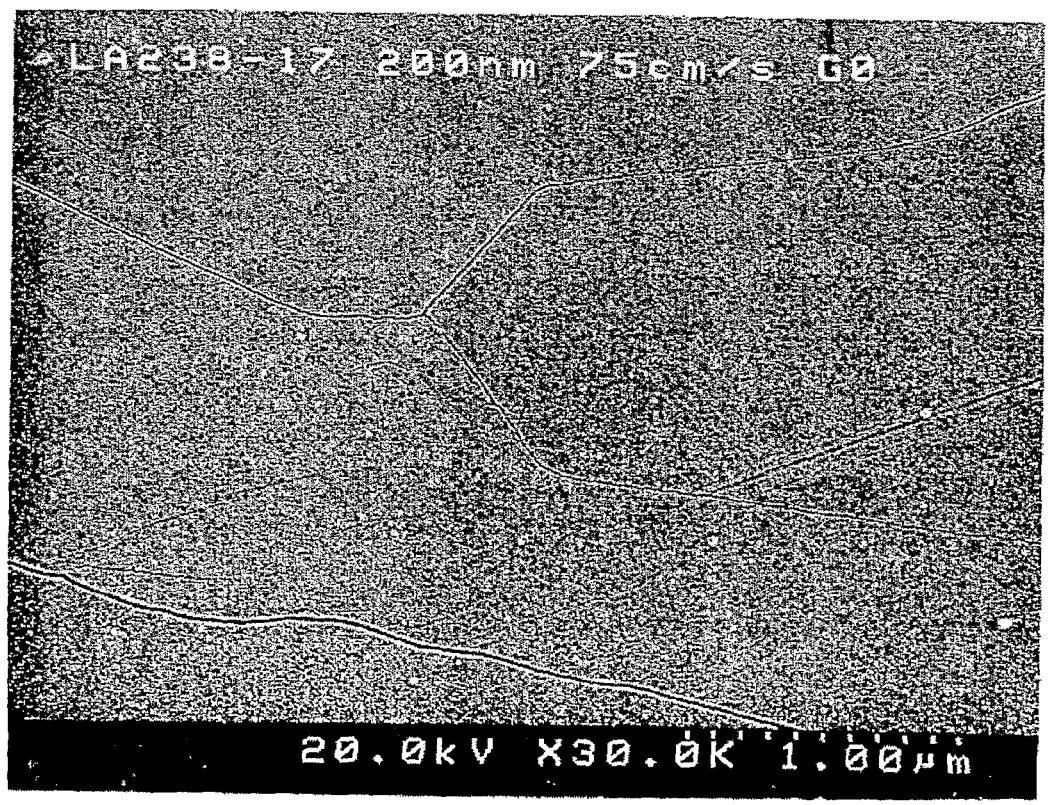
Figure 21:
FIG. 21 is a SEM image of a second region.

FIGS. 20A and 20B are SEM (Scanning Electron Microscope) images of the first region obtained by the crystallization with the use of the second harmonic of a continuous wave Nd: YVO$_4$ laser. FIG. 20A is an SEM image enlarged by 10,000 times, and FIG. 20B is an SEM image enlarged by 30,000 times. FIG. 21 is a SEM image enlarged by 30,000 times for showing the second region obtained by crystallization with the use of the second harmonic of the continuous wave Nd: YVO$_4$ laser. In all of FIGS. 20A to 21, a sample is an amorphous semiconductor having a thickness of 200 nm that is irradiated with the laser beam at a scanning speed of 75 cm/s and that is etched by a Secco solution (a solution of HF:H$_2$O=2:1 including K$_2$Cr$_2$O$_7$ as an addition agent) so that the crystal grain boundary becomes obvious.

FIGS. 20A and 20B indicate that the first region has a crystal grain grown continuously to the scanning direction. The crystal grain in the first region has a width of approximately 10 to 30 μm in the scanning direction and a width of approximately 1 to 5 μm in the direction perpendicular to the scanning direction. FIG. 21 indicates that the crystal grain in the second region has a diameter of approximately 0.2 to several μm.

In the present invention, a semiconductor element used for a circuit except the random ROM in the integrated circuit is formed by using the first region 102 in the semiconductor film. The memory element for the random ROM is formed with the second region 103 in the semiconductor film.

Figure 1B:
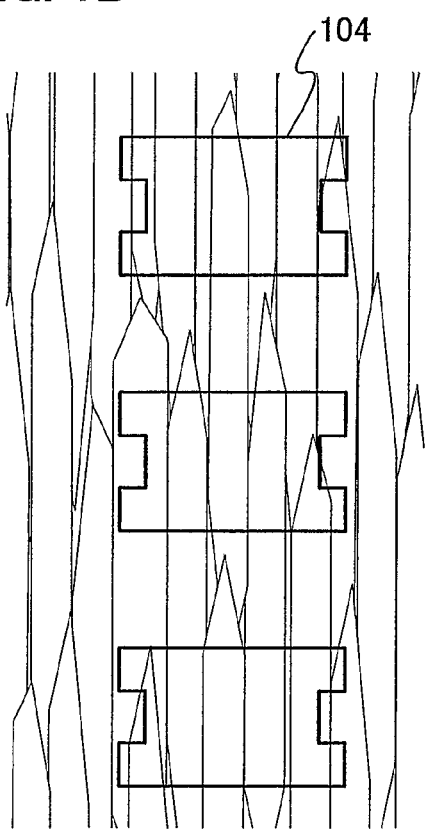
FIGS. 1B and 1C are top views of crystallized semiconductor films.

FIG. 1B is a layout of an active layer 104 of a TFT formed in the first region 102. It is desirable to form the active layer 104 so that a direction in which the carrier moves conforms to a scanning direction of the laser beam. It is considered that when the direction in which the carrier moves is the same as the scanning direction of the laser beam, the crystal grain boundary does not cross the direction in which the carrier moves and that the TFTs having the relatively uniform characteristics can be formed.

Figure 1C:
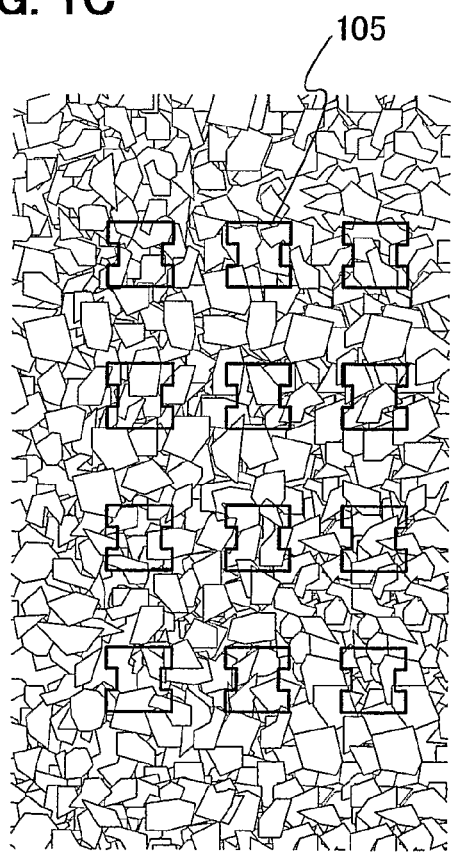

FIG. 1C is a layout of an active layer 105 of a TFT used as a memory element formed in the second region 103. It is preferable that the active layer 105 is formed so that the channel length L is at least a half of the diameter X of the crystal grain and at most two to three times larger than the diameter thereof. In other words, an inequality of X/2≦L≦3X may be satisfied. With the above structure, one or a plurality of crystal grain boundaries across the direction in which the carrier moves are formed in the active layer 105. It is desirable that the number of crystal grain boundaries across the direction in which the carrier moves varies between the active layers 105 to such a degree that the data differ between the memory elements.

Figure 2A:
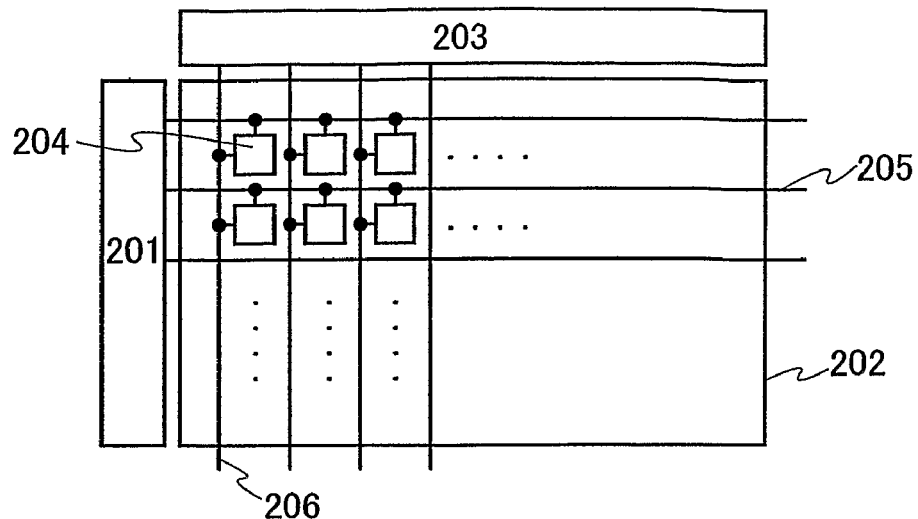
FIG. 2A is a block diagram showing a constitution of a random ROM.

Next, a specific structure of the random ROM is described with reference to FIG. 2A. FIG. 2A shows an example of the random ROM including a decoder 201, a memory cell array 202, and a readout circuit 203. A plurality of memory cells 204 are arranged in a matrix form in the memory cell array 202, and each memory cell 204 is connected to a word line 205 and a bit line 206.

One of the memory cells 204 that has a particular address is selected when the word line 205 is selected by the decoder 201 and the bit line 206 is selected by the readout circuit 203. The data can be read from the selected memory cell 204 by amplifying the electric potential of the selected bit line 206 in the readout circuit 203.

Figure 2B:
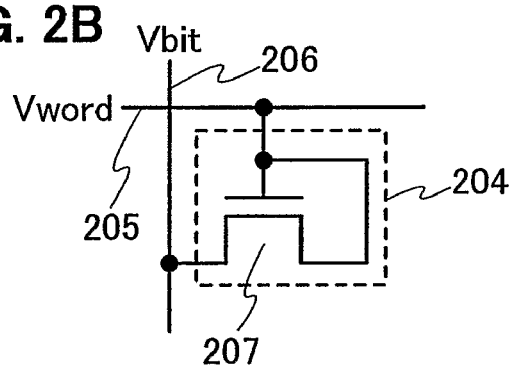
FIG. 2B is a circuit diagram of each memory cell.

FIG. 2B shows an example of the memory cell 204. The memory cell 204 includes a TFT 207 used as a memory element. One of a source region and a drain region of the TFT 207 is connected to the bit line 206 and the other is connected to the word line 205. Moreover, the gate electrode of the TFT 207 is connected to the word line 205.

Figure 2C:
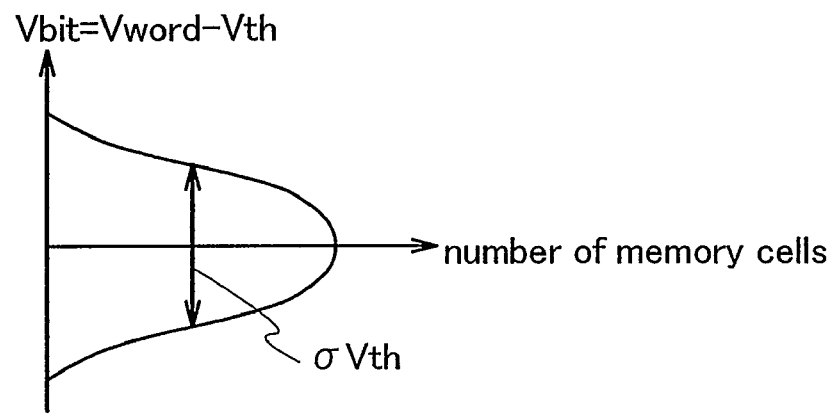
FIG. 2C is a graph for showing distribution of the memory cell.

When the voltage $V_{word}$ that is higher than the threshold voltage $V_{th}$ of the TFT 207 is applied to the word line 205 in the memory cell 204, a voltage $V_{bit}$ of the bit line 206 can be obtained from the equation $V_{bit}=V_{word}-V_{th}$. It is noted that since the threshold voltage $V_{th}$ of the TFT 207 varies due to the crystal grain boundary, the voltage $V_{bit}$ of the bit line 206 also varies. FIG. 2C shows the distribution of the number of memory cells 204 to the voltage $V_{bit}$ of the bit line 206 when the variation of the threshold voltage $V_{th}$ is denoted as $\sigma V_{th}$. As shown in FIG. 2C, the voltage $V_{bit}$ of the bit line 206 has the unique value corresponding to each memory cell 204 by the variation of the threshold voltages $V_{th}$ of the TFTs 207 in the memory cell 204.

Next, an example of the functional structure of the ID chip of the present invention is described with reference to FIG. 3.

Figure 3:
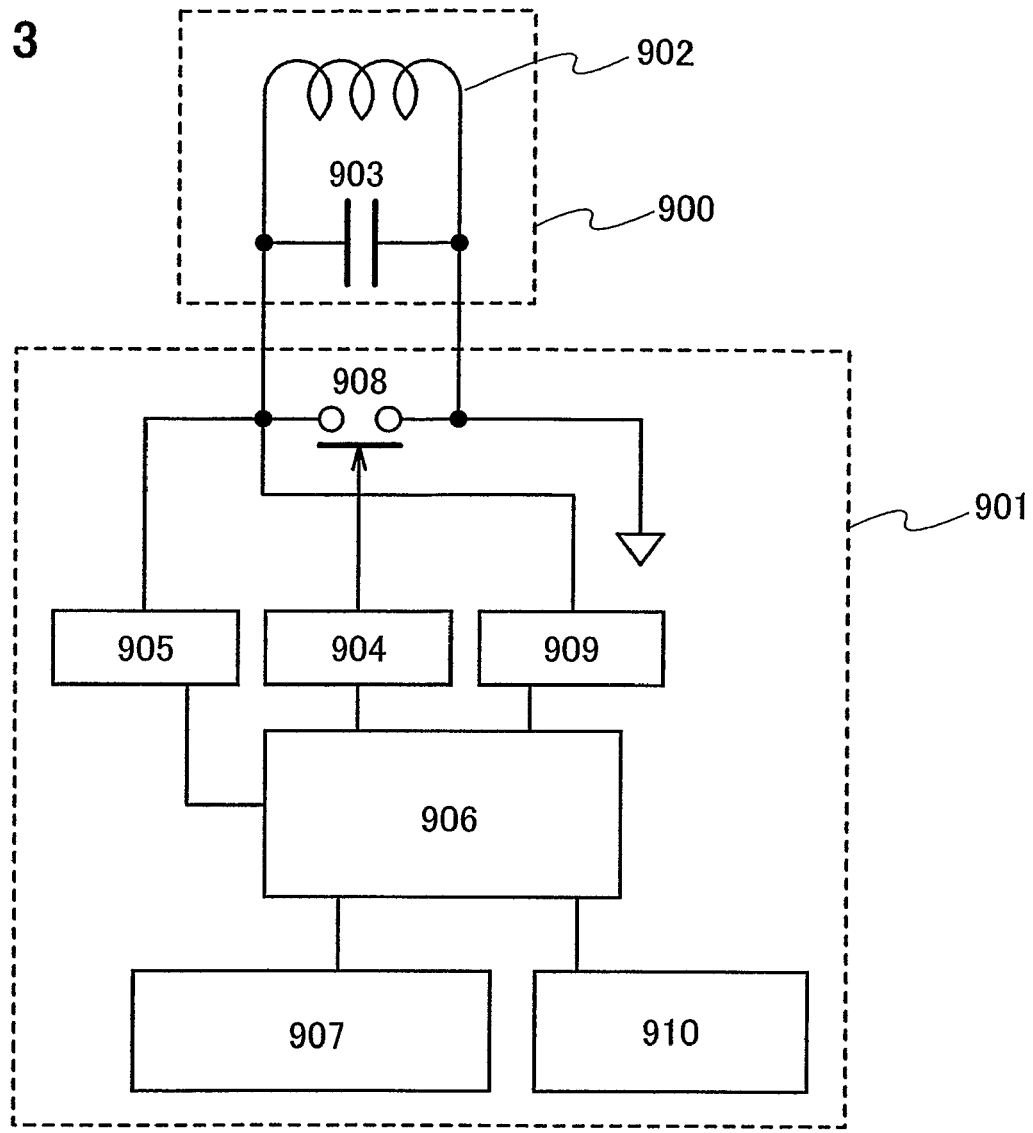
FIG. 3 is a block diagram showing an example of a functional constitution of the ID chip of the present invention.

In FIG. 3, a reference numeral 900 denotes an antenna and a reference numeral 901 denotes an integrated circuit. The antenna 900 includes an antenna coil 902 and a capacitor element 903 formed in the antennal coil 902. Moreover, the integrated circuit 901 includes a demodulator circuit 909, a modulator circuit 904, a rectifier circuit 905, a microprocessor 906, a memory 907, a switch 908 for giving load modulation to the antenna 900, and a random ROM 910. The number of memories 907 is not limited to one, and it may be more than one. For example, a SRAM, a flash memory, a ROM, a FRAM®, or the like can be used.

A signal sent from the reader/writer as an electric wave is converted into an alternating electric signal in the antenna coil 902 by electromagnetic induction. The demodulator circuit 909 demodulates the alternating electric signal and sends it to the microprocessor 906 in the following stage. The rectifier circuit 905 generates a power supply voltage by using the alternating electric signal and supplies it to the microprocessor 906 in the following stage.

The microprocessor 906 performs various arithmetic processes in accordance with the input signal. The memory 907 not only stores a program, data, and the like used in the microprocessor 906 but also serves as a workplace at the arithmetic process.

The unique data of the ID chip are stored in the random ROM 910. When the signal specifying the address is sent to the random ROM 910 from the microprocessor 906, the random ROM 910 can read out the data stored in the memory cell at the specified address and send it to the microprocessor 906.

Then, when the modulator circuit 904 receives the data from the microprocessor 906, the modulator circuit 904 can control the switch 908 so as to add the load modulation to the antenna coil 902 based on the data. The reader/writer can read the data from the microprocessor 906 by receiving the load modulation added to the antenna coil 902 by means of the electromagnetic wave.

The ID chip of the present invention does not always need to have the antenna 900. When the ID chip does not have the antenna 900, a connection terminal for connecting electrically with the antenna 900 may be provided.

The ID chip shown in FIG. 3 is just an example of the present invention, and the present invention is not limited to the above structure. The ID chip of the present invention does not always need to have the microprocessor 906 and the memory 907. Moreover, the signal may be transmitted not only by the electromagnetic coupling system as shown in FIG. 3 but also by electromagnetic induction system, microwave system, or any other transmitting systems.

Next, a layout of the integrated circuit and a layout of the first region and the second region formed by the laser irradiation are described with reference to FIG. 4.

Figure 4:
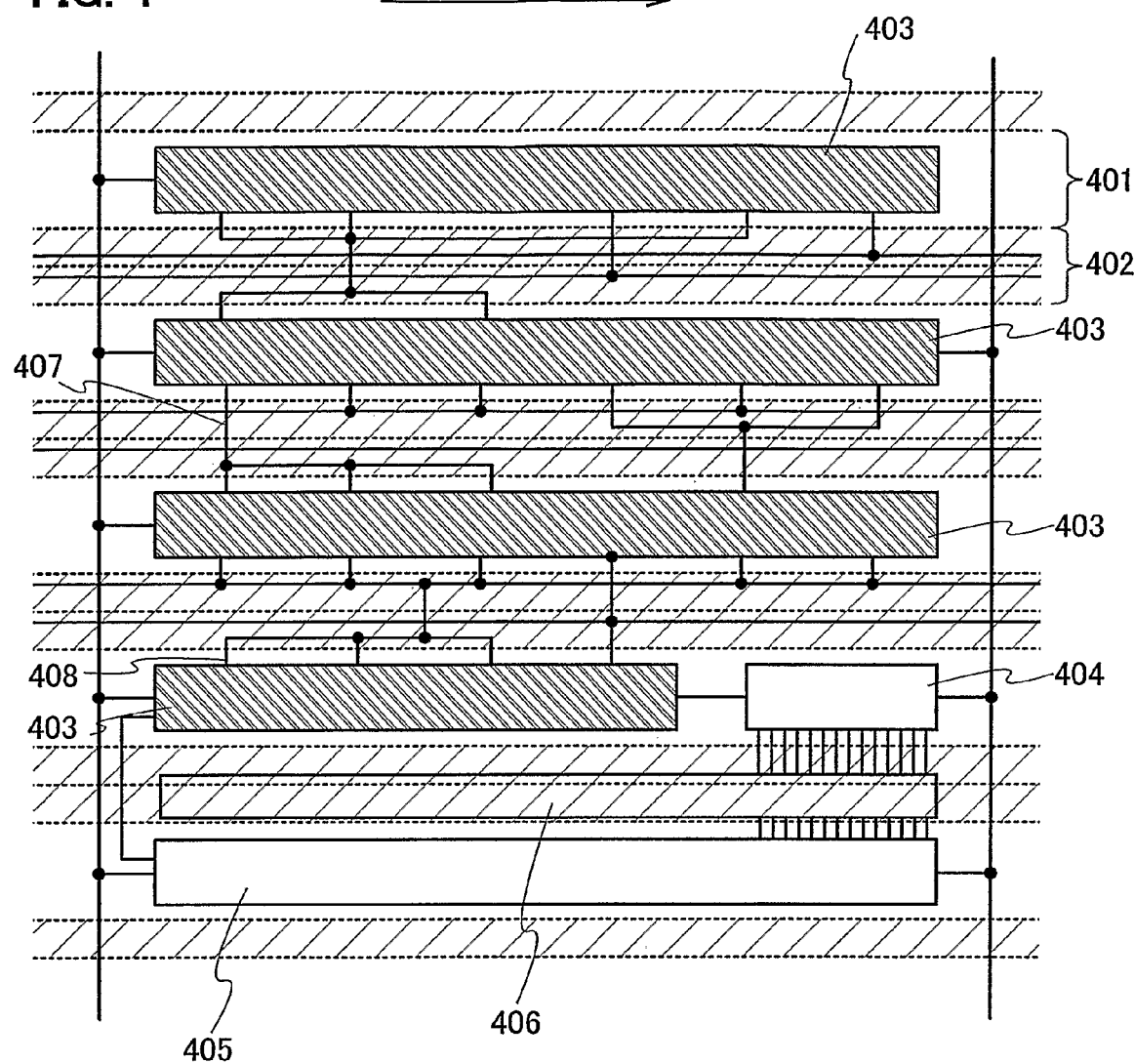
FIG. 4 is a drawing for showing a layout of an integrated circuit and a layout of a first region and a second region formed by the laser irradiation.

FIG. 4 is an example of the layout of a first region 401 and a second region 402. The first region 401 has the large crystal grain grown continuously in the scanning direction of the laser beam, which is indicated by the arrow in the figure. The second region 402 tends to have the microcrystal. The first region 401 and the second region 402 are formed alternately both of which extend in the scanning direction indicated by the arrow in the figure.

FIG. 4 is a layout of the integrated circuit. A reference numeral 403 denotes a group of circuits except the random ROM in the integrated circuit, a reference numeral 404 denotes a readout circuit in the random ROM, a reference numeral 405 denotes a decoder in the random ROM, and a reference numeral 406 denotes a memory cell array in the random ROM.

At least the memory cell array 406 is formed in the second region 402 having the microcrystal. The circuits 403 except the random ROM are formed in the first region 401 having the large crystal grain grown continuously. A wiring (for example 407) for connecting the circuits 403 except the random ROM and a wiring (for example 408) for connecting each circuit 403 except the random ROM with the readout circuit 404, the decoder 405, or the memory cell array 406 can be formed across the second region 402.

It is noted that all the circuits 403 except the random ROM are not necessarily formed in the first region 401. For example, the circuit in which the high-speed operation is required and the circuit in which the variation of the characteristics of the semiconductor elements needs to reduce may be arranged in the first region 401 and the other circuits may be formed in the second region 402.

Although both the readout circuit 404 for the random ROM and the decoder 405 are arranged in the first region 401 in FIG. 4, the present invention is not limited to this constitution. The readout circuit 404 or the decoder 405 may be arranged in the second region 402 with the memory cell array 406.

Next, a method for manufacturing the ID chip of the present invention is described in detail. Although this embodiment mode describes an example of an electrically isolated TFT as a semiconductor element, the semiconductor element for the integrated circuit is not limited to this, and any kinds of circuit elements can be used. For example, a recording element, a diode, a photoelectric conversion element, a resistance element, a coil, a capacitor element, or an inductor is typically given.

Figure 5A:
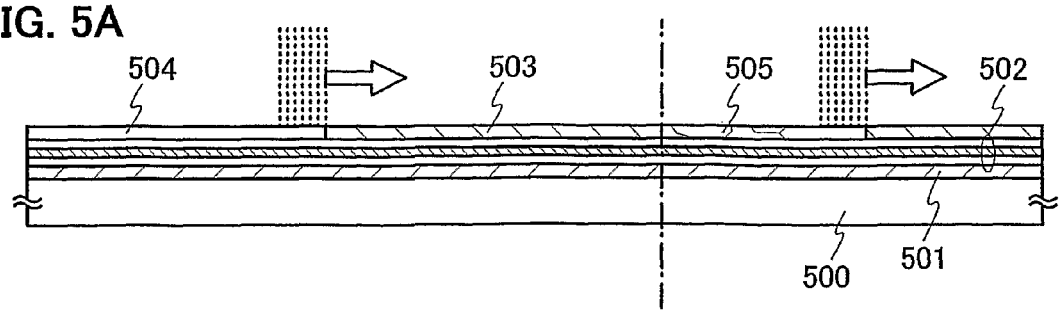
FIGS. 5A to 5E are drawings for showing a manufacturing process of the ID chip of the present invention.

As shown in FIG. 5A, a stripping layer 501 is formed over a heat-resistant substrate (a first substrate) 500 by sputtering. As the first substrate 500, a glass substrate made of barium borosilicate glass or aluminoborosilicate glass, a quartz substrate, a ceramic substrate, or the like can be used. Moreover, a metal substrate including a SUS substrate or a semiconductor substrate with an insulating film formed over its surface may be used. Although a flexible substrate such as a plastic substrate is inferior to the above substrates in the heat resistance, the flexible substrate can be also used when the substrate can resist the heat in the manufacturing process.

The stripping layer 501 can be formed of a silicon-based layer such as amorphous silicon, poly-crystalline silicon, single-crystal silicon, or microcrystal silicon (including semi-amorphous silicon). The stripping layer 501 can be formed by sputtering, reduced-pressure CVD, plasma-CVD, or the like. In this embodiment mode, the stripping layer 501 is formed of the amorphous silicon in approximately 50 nm thick by reduced-pressure CVD. The material of the stripping layer 501 is not limited to silicon, and a material that can be selectively etched away may be used. It is preferable that the stripping layer 501 of the amorphous silicon has the thickness from 50 to 60 nm. When the stripping layer 501 is formed of the semi-amorphous silicon, it may be formed in thickness from 30 to 50 nm.

Next, a base film 502 is formed over the stripping layer 501. The base film 502 is provided in order to prevent alkali-earth metal or alkali metal such as Na in the first substrate 500 from diffusing into the semiconductor film. The alkali-earth metal and the alkali metal have an adverse effect on the characteristic of a semiconductor element such as a TFT when they are in the semiconductor. Another purpose of providing the base film 502 is to protect the semiconductor element in the following step for stripping the semiconductor element. The base film 502 may be a single insulating film or may include a plurality of insulating films. Accordingly, the base film 502 is formed of an insulating material such as silicon oxide, silicon nitride, or silicon nitride oxide which can suppress the diffusion of the alkali metal or the alkali-earth metal into the semiconductor film.

In this embodiment mode, the base film 502 is formed by laminating a SiON film having a thickness of 100 nm, a SiNO film having a thickness of 50 nm, and a SiON film having a thickness of 100 nm in order. However, the material, the thickness, and the number of laminated films are not limited to the above description. For example, a siloxane resin having a thickness from 0.5 to 3 μm may be formed by spin coating, a slit coater method, a droplet-discharging method, or the like instead of the SiON film, which is the lowest layer. A silicon nitride film ($SiN_x$, $Si_3N_4$, or the like) may be used instead of the SiNO film, which is the middle layer. A $SiO_2$ film may be used instead of the SiON film, which is the top layer. The thickness of each film is desirably in the range of 0.05 to 3 μm, and the thickness may be selected freely in this range.

Alternatively, the lowest layer of the base film 502, which is closest to the stripping layer 501, may be the SiON film or the $SiO_2$ film, the middle layer may be formed of the siloxane resin, and the top layer may be the $SiO_2$ film.

The silicon oxide film can be formed by thermal CVD plasma CVD normal-pressure CVD bias ECRCVD or the like while using a mixed gas of $SiH_4/O_2$, TEOS (tetra-ethoxy-silane)/$O_2$, or the like. The silicon nitride film can be formed by plasma CVD while using a mixed gas of $SiH_4/NH_3$ typically. The silicon oxynitride film ($SiO_xN_y$: x>y) and the silicon nitride oxide film ($SiN_xO_y$: x>y) can be formed by plasma CVD while using a mixed gas of $SiH_4/N_2O$ typically.

Next, a semiconductor film 503 is formed over the base film 502. It is desirable to form the semiconductor film 503 after forming the base film 502 without exposing it to the air. The semiconductor film 503 may have the thickness from 20 to 200 nm (desirably from 40 to 170 nm and more desirably from 50 to 150 nm). The semiconductor film 503 may be an amorphous semiconductor, a semi-amorphous semiconductor, or a poly-crystalline semiconductor. The semiconductor may be silicon or may be silicon germanium. In the case that silicon germanium is used, the density of germanium is preferably 0.01 to 4.5 atomic %.

The amorphous semiconductor can be obtained by glow-discharging to decompose a silicide gas. As a typical silicide gas, $SiH_4$, $Si_2H_6$, or the like is given. This silicide gas may be diluted with hydrogen or with hydrogen and helium.

The semi-amorphous semiconductor has an intermediate characteristic between the amorphous semiconductor and the crystalline semiconductor (the crystalline semiconductor includes a single crystal semiconductor and a poly-crystal semiconductor) and has a third state that is stable in free energy. Moreover, the semi-amorphous semiconductor includes a crystalline region having short-range order and having lattice distortion. The semi-amorphous semiconductor has a crystal grain having a width from 0.5 to 20 nm that is diffused in the non-single crystal semiconductor film, and the raman spectrum shifts to the side of lower wave number than 520 $cm^{-1}$. According to an X-ray diffraction, diffraction peaks of (111) and (220) of Si is observed. As a terminating agent of a dangling bond, hydrogen or halogen is added by at least 1 atomic % or more. The semiconductor like this is herein referred to as a semi-amorphous semiconductor (SAS) for convenience. Moreover, a fine semi-amorphous semiconductor with higher stability can be obtained by promoting the lattice distortion in such a way that a noble gas element such as helium, argon, krypton, or neon is added.

The SAS can be obtained by glow-discharging to decompose the silicide gas. As the typical silicide gas, $SiH_4$ is given. Besides, $Si_2H_6$, $SiH_2Cl_2$, $SiHCl_3$, $SiCl_4$, $SiF_4$, or the like can be used. Furthermore, when the silicide gas is diluted with hydrogen or with a mixed gas of hydrogen and one or a plurality of noble gas elements selected from the group consisting of helium, argon, krypton, and neon, the semi-amorphous semiconductor can be easily formed. The dilution ratio is preferably from 2 to 1000 times. Moreover, a carbide gas such as $CH_4$ or $C_2H_6$, a germanium gas such as $GeH_4$ or $GeF_4$, $F_2$, or the like may be mixed into the silicide gas so that the energy band width ranges from 1.5 to 2.4 eV or from 0.9 to 1.1 eV.

For example, when a TFT is formed of a semi-amorphous semiconductor manufactured by using a $SiH_4$ gas diluted with $H_2$ or a $SiH_4$ gas diluted with $F_2$, the TFT can have the subthreshold coefficient (S value) of 0.35 V/sec or less, typically in the range of 0.09 to 0.25 V/sec, and the mobility of 10 $cm^2$/Vsec. When this TFT formed of the semi-amorphous semiconductor is used to form 19-stage ring oscillator, it is possible to obtain the pulse repetition rate from 1 to 100 MHz or more at the power supply voltage from 3 to 5 V. Moreover, at the voltage from 3 to 5 V, the delay time is made 26 ns or less, preferably 0.26 nm or less per one inverter.

Then, as shown in FIG. 5A, the semiconductor film 503 is crystallized by using the laser. Moreover, the crystallization method using the laser may be combined with a crystallization method using a catalyst element.

Before the laser crystallization, it is desirable to perform thermal annealing for one hour at 500° C. in order to increase the resistance of the semiconductor film against the laser. Then, the semiconductor film is irradiated with the laser beam having any one of second to fourth harmonics of the fundamental wave from a continuous wave solid-state laser. Thus, a crystal having large grain sizes can be obtained. For example, typically, it is preferable to use the second harmonic (532 nm) or the third harmonic (355 nm) of a Nd:$YVO_4$ laser (fundamental wave 1064 nm). Specifically, the fundamental wave emitted from the continuous wave $YVO_4$ laser is converted into the harmonic having a power of 10 W by a non-linear optical element. It is preferable to shape the laser beam into rectangular or elliptical on an irradiated surface through an optical system. The laser beam needs to have the energy density from approximately 0.01 to 100 $MW/cm^2$ (preferably from 0.1 to 10 $MW/cm^2$). The scanning speed is set in the range of approximately 10 to 2000 cm/s.

The laser may be a known continuous wave gas laser or solid-state laser. As the gas laser, there is an Ar laser, a Kr laser, or the like. As the solid-state laser, there is a laser using a single crystal such as a $GdVO_4$ laser, a YAG laser, a $YVO_4$ laser, a YLF laser, a $YAlO_3$ laser, a glass laser, a ruby laser, an alexandrite laser, or a Ti: Sapphire laser. The solid-state laser also includes a ceramic laser using poly crystals such as a $Y_2O_3$ laser.

Moreover, a pulsed laser may be employed. In this case, the pulse repetition rate is set to 10 MHz or more. This repetition rate is extremely higher than that of the pulsed laser used usually, which is from several ten to several hundred Hz. It is said that it takes several ten to several hundred nanoseconds to solidify the semiconductor film completely after the semiconductor film is irradiated with the pulsed laser beam. When the pulsed laser beam has a repetition rate of 10 MHz or more, it is possible to irradiate the pulsed laser beam after the semiconductor film is melted by the previous pulsed laser beam and before the semiconductor film is solidified. Therefore, the interface between the solid phase and the liquid phase can be moved continuously in the semiconductor film, and the semiconductor film having a crystal grain grown continuously toward the scanning direction is formed. Specifically, it is possible to form an aggregation of crystal grains each of which has a width from 10 to 30 μm in the scanning direction and a width from approximately 1 to 5 μm in a direction perpendicular to the scanning direction. It is also possible to form a semiconductor film having almost no crystal grain boundaries at least in the channel length direction of the TFT by forming a crystal grain extending long in the scanning direction, in which crystal axes are directed approximately in one direction.

A semiconductor film with higher crystallinity is formed by the above laser irradiation. The semiconductor film includes a first region 504 formed by a center region of the beam spot and a second region 505 formed by a region adjacent to an edge of the beam spot. The first region 504 includes a crystal grain having a width from 10 to 30 μm in the scanning direction and a width from 1 to 5 μm in a direction perpendicular to the scanning direction. On the other hand, the second region 505 has microcrystal grains having grain sizes from 0.2 to several μm whose positions and sizes are random.

Figure 5B:
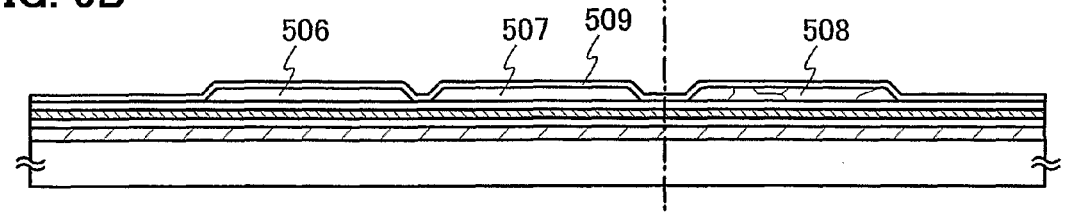

Next, as shown in FIG. 5B, the first region 504 and the second region 505 in the crystallized semiconductor film are patterned so that the first region 504 becomes island-shaped semiconductor films 506 and 507 and that the second region 505 becomes an island-shaped semiconductor film 508. Then, a gate insulating film 509 is formed so as to cover the island-shaped semiconductor films 506 to 508. The gate insulating film 509 may be a single layer or a multilayer formed including silicon nitride, silicon oxide, silicon nitride oxide, or silicon oxynitride by plasma CVD or sputtering. In the case of the multilayer, for example, the gate insulating layer 509 is preferably formed by laminating a silicon oxide film, a silicon nitride film, and a silicon oxide film in order from the substrate side.

After forming the gate insulating film 509, heat treatment may be performed under an atmosphere including hydrogen by 3 to 100% at a temperature from 300 to 450° C. for 1 to 12 hours in order to hydrogenate the island-shaped semiconductor films 506 to 508. In the hydrogenation process, a dangling bond can be terminated by using the thermally excited plasma. As another means for the hydrogenation, plasma hydrogenation (using hydrogen that has become plasma) may be performed. After pasting the semiconductor element to a second substrate that is flexible in the following step, a defect may be formed in the semiconductor film by bending the second substrate. However, in this case, a dangling bond due to the defect can be terminated by the hydrogen in the semiconductor film when the density of hydrogen in the semiconductor film is $1\times10^{19}$ to $1\times10^{22}$ atoms/cm$^3$, preferably $1\times10^{19}$ to $5\times10^{20}$ atoms/cm$^3$ by the hydrogenation. Moreover, in order to terminate the dangling bond due to the defect, halogen may be added in the semiconductor film.

Figure 5C:
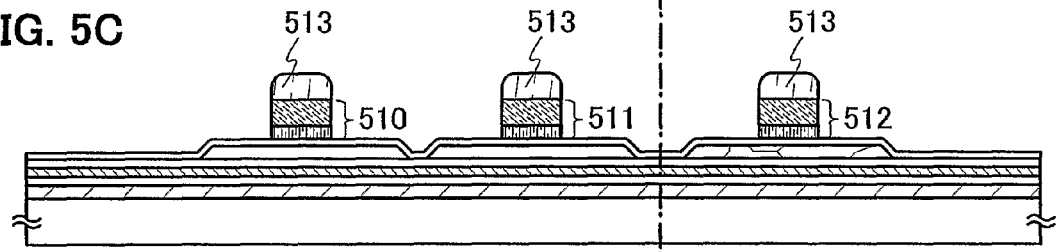

Next, as shown in FIG. 5C, gate electrodes 510 to 512 are formed. In this embodiment mode, the gate electrodes 510 to 512 are multilayers of Si and W which are formed by sputtering and then etched by using a resist 513 as a mask. The material, the structure, and the manufacturing method of these gate electrodes 510 to 512 are not limited to the above, and they may be selected appropriately. For example, the gate electrodes 510 to 512 may be a multilayer including NiSi (nickel silicide) and Si in which an impurity imparting n-type is added or a multilayer including TaN (tantalum nitride) and W (tungsten). Moreover, the gate electrodes 510 to 512 may be a single layer formed of various kinds of conductive materials.

Instead of the resist mask, a mask formed of SiO$_x$ or the like may be used. In this case, an additional process is performed to form the mask (referred to as a hard mask) by patterning SiO$_x$, SiON, or the like. However, since the material of this mask is not reduced by the etching so much as the resist mask, the gate electrodes 510 to 512 having the desired width can be formed. Moreover, the gate electrodes 510 to 512 may be formed selectively by the droplet-discharging method without using the mask.

The conductive material can be selected from various materials in accordance with the function of the conductive film. When the gate electrode is formed simultaneously with the antenna, the materials may be selected in consideration of their functions.

Although a mixed gas of CF$_4$, Cl$_2$, and O$_2$ or a gas of Cl$_2$ is used as an etching gas for forming the gate electrodes, the present invention is not limited to this.

Figure 5D:
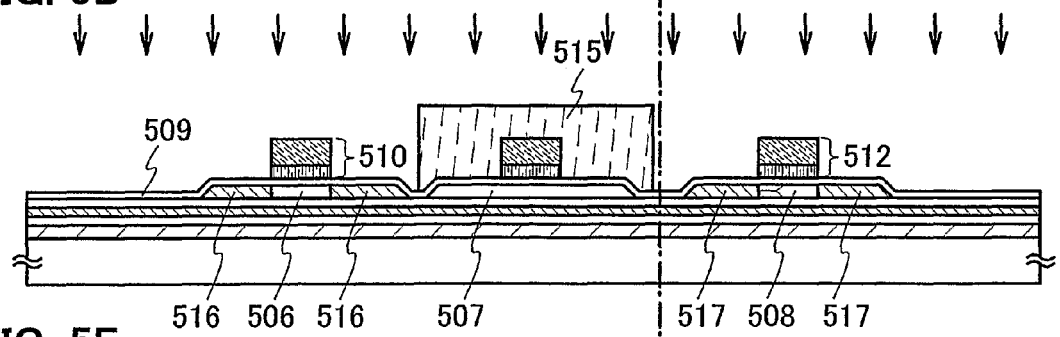

Next, as shown in FIG. 5D, the island-shaped semiconductor film 507 to become a p-channel TFT is covered by a resist 515, and then an impurity element imparting n-type (typically P (phosphorus) or As (arsenic)) is doped at low density in the island-shaped semiconductor films 506 and 508 by using the gate electrodes 510 to 512 as the mask (a first doping process). The first doping process is performed under the condition where the dosage ranges from $1\times10^{13}$ to $6\times10^{13}$/cm$^2$ and the accelerating voltage ranges from 50 to 70 kV. However, the present invention is not limited to this condition. In the first doping process, the doping is performed through the gate insulating film 509, and two pairs of low-density impurity regions 516 and 517 are formed in the island-shaped semiconductor films 506 and 508. It is noted that the first doping process may be performed without covering the island-shaped semiconductor film 507 to be the p-channel TFT by the resist.

Figure 5E:
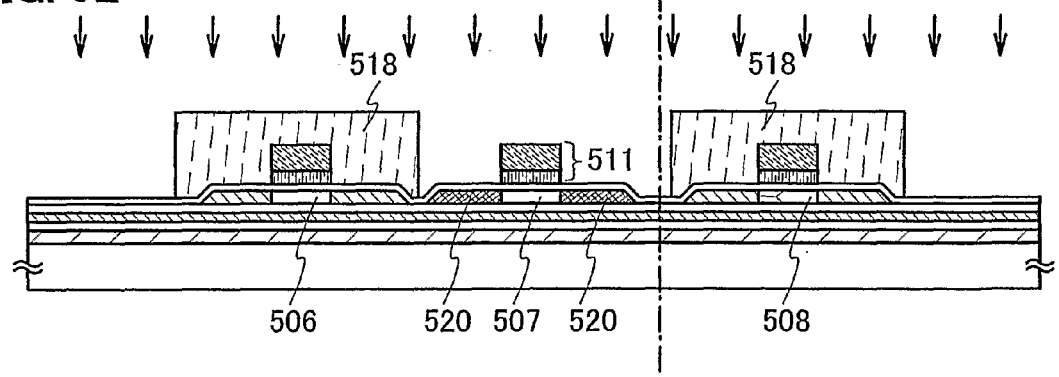

Next, as shown in FIG. 5E, after removing the resist 515 by ashing or the like, a resist 518 is newly formed so as to cover the island-shaped semiconductor films 506 and 508 to be n-channel TFTs. Then, an impurity element imparting p-type (typically B (boron)) is doped at high density in the island-shaped semiconductor film 507 by using the gate electrode 511 as a mask (a second doping process). The second doping process is performed under the condition where the dosage ranges from $1\times10^{16}$ to $3\times10^{16}$/cm$^2$ and the accelerating voltage ranges from 20 to 40 kV. In the second doping process, the doping is performed through the gate insulating film 509, and a pair of p-type high-density impurity regions 520 is formed in the island-shaped semiconductor film 507.

Figure 6A:
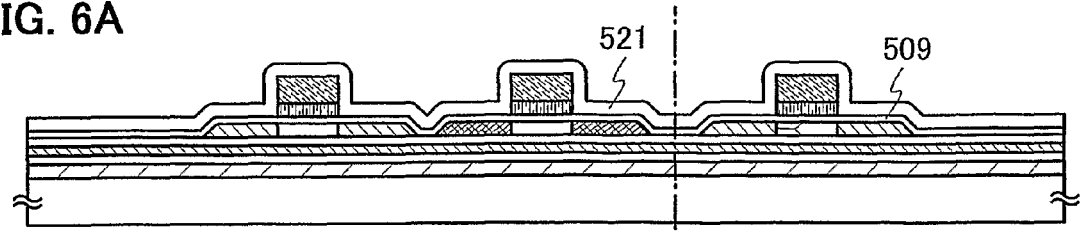
FIGS. 6A to 6E are drawings for showing a manufacturing process of the ID chip of the present invention.
Figure 6B:
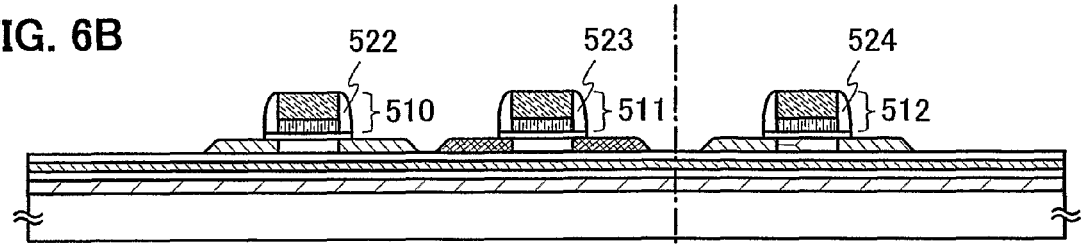

Next, as shown in FIG. 6A, after removing the resist 518 by ashing or the like, an insulating film 521 is formed so as to cover the gate insulating film 509 and the gate electrodes 510 to 512. In this embodiment mode, the insulating film 521 is formed of SiO$_2$ in 100 nm thick by plasma CVD. After that, the insulating film 521 and the gate insulating film 509 are partially etched by an etch-back process to form sidewalls 522 to 524 in contact with the sides of the gate electrodes 510 to 512 in a self-aligning manner. A mixed gas of CHF$_3$ and He is used as the etching gas. It is noted that the process for forming the sidewall is not limited to this.

When forming the insulating film 521, the insulating film 521 may be also formed at the rear surface of the substrate. In this case, after forming the sidewall, resist may be formed all over the front surface of the substrate, and then the insulating film formed at the rear surface of the substrate may be selectively removed by etching. Alternatively, when forming the sidewall in the etch back process, the insulating film 521 and the gate insulating film 509 may be partially removed simultaneously with the whole insulating film formed at the rear surface of the substrate.

It is noted that the sidewalls 522 and 524 will serve as the masks when a low-density impurity region or non-doped off-set region is formed under the sidewalls 522 and 524 by doping an impurity imparting n-type at high density. Therefore, in order to control the width of the low-density impurity region or the off-set region, the size of the sidewalls may be adjusted by changing the condition of the etch-back process for forming the sidewall appropriately.

Figure 6C:
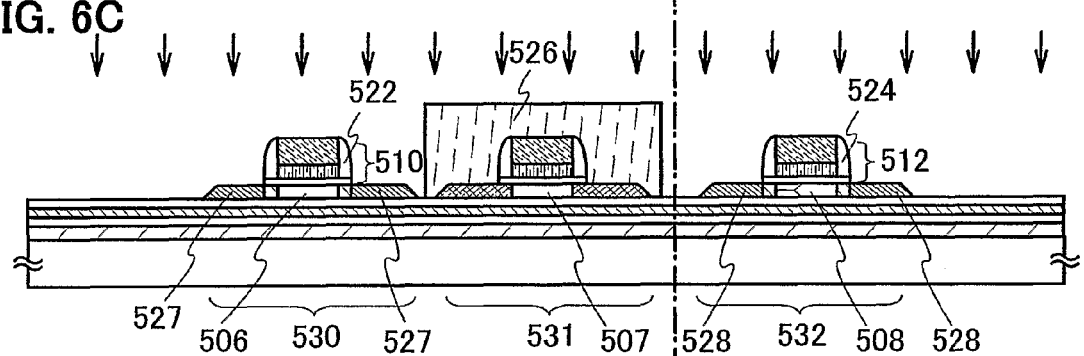

Next, as shown in FIG. 6C, a resist 526 is newly formed so as to cover the island-shaped semiconductor film 507 to be the p-channel TFT. Then, an impurity imparting n-type (typically P or As) is doped at high density by using the gate electrodes 510 and 512 and the sidewalls 522 and 524 as the masks (a third doping process). The third doping process is performed under the condition where the dosage ranges from $1\times10^{13}$ to $5\times10^{15}$/cm$^2$ and the accelerating voltage ranges from 60 to 100 kV. In the third doping process, the doping is performed, and two pairs of n-type high-density impurity regions 527 and 528 are formed in the island-shaped semiconductor films 506 and 508.

After removing the resist 526 by ashing or the like, thermal activation of the impurity region may be performed. For example, after forming a SiON film having a thickness of 50 nm, heat treatment is performed for four hours under a nitrogenous atmosphere of 550° C. When a $SiN_x$ film including hydrogen is formed in 100 nm thick and then heat treatment is performed thereto for one hour under a nitrogenous atmosphere of 410° C., a defect in the poly-crystalline semiconductor film can be restored. This treatment is, for example, to terminate the dangling bond in the poly-crystalline semiconductor film and is called a hydrogenation process or the like.

According to these processes, an n-channel TFT 530, a p-channel TFT 531, and an n-channel TFT 532 are formed. When the size of the sidewall is adjusted by changing the condition of the etch-back process appropriately in these manufacturing processes, a TFT having the channel length from 0.2 to 2 μm can be formed. Although the TFTs 530 to 532 have a top-gate structure in this embodiment mode, they may have a bottom-gate structure (reversely staggered structure).

After that, a passivation film may be formed to protect the TFTs 530 to 532, although the passivation film is not shown in the drawing. It is desirable that the passivation film is formed of silicon nitride, silicon nitride oxide, aluminum nitride, aluminum oxide, silicon oxide, or the like which can prevent the intrusion of alkali metal or alkali-earth metal into the TFTs 530 to 532. Specifically, for example, a SiON film having a thickness of approximately 600 nm can be used as the passivation film. In this case, the hydrogenation process may be performed after forming the SiON film. As another example, the passivation film may include three layers of a SiON film, a $SiN_x$ film, and a SiON film which are formed sequentially from the substrate side over the TFTs 530 to 532. However, the structure and the materials of these films are not limited to the above description. With the above structure, since the TFTs 530 to 532 are covered by the base film 502 and the passivation film, it is possible to prevent the alkali-earth metal or the alkali metal such as Na from diffusing into the semiconductor film used for the semiconductor element. The alkali-earth metal and the alkali metal have an adverse effect on the characteristic of the semiconductor element when they are in the semiconductor.

Figure 6D:
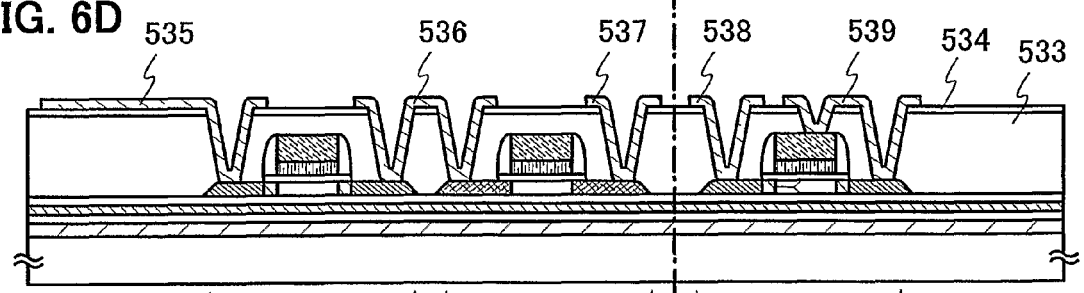

Next, as shown in FIG. 6D, a first interlayer insulating film 533 is formed over the TFT 530 to 532. The first interlayer insulating film 533 can be formed of an organic resin having heat resistance such as polyimide, acrylic, or polyamide. Besides, a low dielectric constant material (low-k material), a resin including Si—O—Si bond formed by using a siloxane material as the starting material (hereinafter this resin is called a siloxane resin), or the like can be used. The siloxane resin may include at least one of hydrogen, fluorine, an alkyl group, and aromatic carbon hydride as a substituent. In addition to the above materials, PSG (phosphorous glass), BPSG (boron phosphorous glass), or alumina may be used. The first interlayer insulating film 533 can be formed by spin coating, dipping, spray coating, the droplet-discharging method (an ink-jet method), printing (a screen printing, an offset printing, or the like), a doctor's knife, a roll coater, a curtain coater, a knife coater, or the like. Moreover, the first interlayer insulating film 533 may be formed by laminating the above insulating films.

In this embodiment mode, a second interlayer insulating film 534 is formed over the first interlayer insulating film 533. The second interlayer insulating film 534 may be formed of a film including carbon such as DLC (diamond-like carbon) or CN (carbon nitride), silicon oxide, silicon nitride, or silicon nitride oxide by plasma CVD, atmospheric-pressure plasma CVD, or the like. Moreover, the second interlayer insulating film 534 may be formed of the siloxane resin or a photosensitive or non-photosensitive organic material such as polyimide, acrylic, polyamide, resist, or benzocyclobuten.

A filler may be mixed into the first interlayer insulating film 533 or the second interlayer insulating film 534 in order to prevent the first interlayer insulating film 533 and the second interlayer insulating film 534 from stripping and damaging due to the stress caused by the difference of the coefficient of thermal expansion between the conductive material for constituting the wiring to be formed afterward and the first interlayer insulating film 533 or the second interlayer insulating film 534.

Next, as shown in FIG. 6D, contact holes are formed through the first interlayer insulating film 533, and the second interlayer insulating film 534, and wirings 535 to 539 to connect with the TFTs 530 to 532 are formed. Although a mixed gas of $CHF_3$ and He is used as the etching gas for forming the contact holes, the present invention is not limited to this. In this embodiment mode, the wirings 535 to 539 include five layers formed by laminating Ti, TiN, Al—Si, Ti, and TiN sequentially from the substrate side by sputtering and by patterning them.

By mixing Si into Al, it is possible to prevent a hillock when baking the resist to pattern the wirings. Cu may be mixed by approximately 0.5% instead of Si. When an Al—Si layer is sandwiched by Ti or TiN, the resistance against the hillock is improved further. It is desirable to use the hard mask formed of SiON or the like at the patterning. The material and the manufacturing process of the wirings are not limited to the above, and the above-mentioned material used as the gate electrode may be used.

It is noted that the wirings 535 and 536 are connected to the high-density impurity region 527 of the n-channel TFT 530, the wirings 536 and 537 are connected to the high-density impurity region 520 of the p-channel TFT 531, and the wirings 538 and 539 are connected to the high-density impurity region 528 of the n-channel TFT 532. The wiring 539 is also connected to the gate electrode 512 of the n-channel TFT 532. The n-channel TFT 532 can be used as the memory element of the random ROM.

Figure 6E:
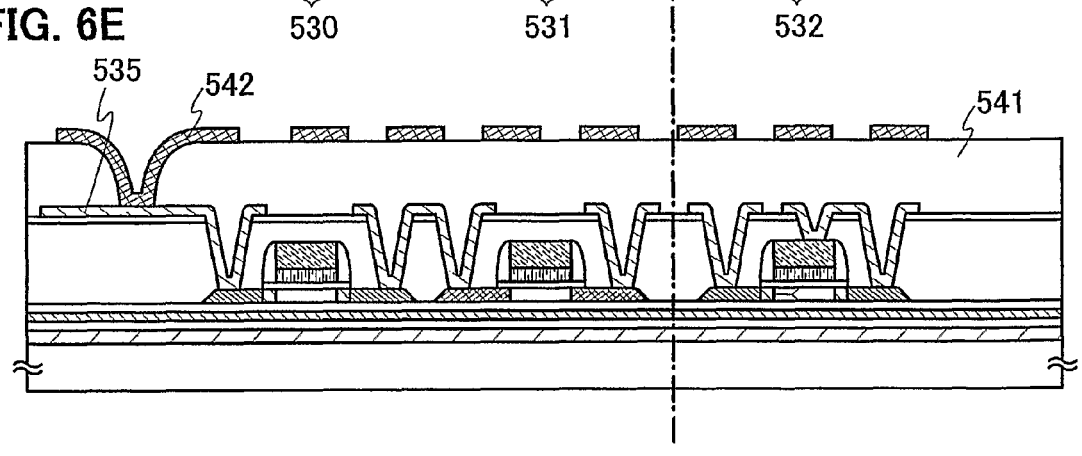

Next, as shown in FIG. 6E, a third interlayer insulating film 541 is formed over the second interlayer insulating film 534 so as to cover the wirings 535 to 539. The third interlayer insulating film 541 is formed in such a way that it has an opening so that the wiring 535 is partially exposed. The third interlayer insulating film 541 can be formed of a material cited in the above for the first interlayer insulating film 533.

Next, an antenna 542 is formed over the third interlayer insulating film 541. The antenna 542 can be formed of a conductive material having one or a plurality of metals or metal compounds of Ag, Au, Cu, Pd, Cr, Mo, Ti, Ta, W, Al, Fe, Co, Zn, Sn, or Ni. The antenna 542 is connected to the wiring 535. Although the antenna 542 is directly connected to the wiring 535 in FIG. 6E, the ID chip of the present invention is not limited to this constitution. For example, the antenna 542 may be connected electrically with the wiring 535 by using a wiring separately formed.

The antenna 542 can be formed by the printing method, a photolithography method, an evaporation method, the droplet-discharging method, or the like. In this embodiment mode, the antenna 542 is formed of a single conductive film. However, the antenna 542 can be formed by laminating a plurality of conductive films. For example, the antenna 542 may be formed of Ni wiring coated with Cu by electroless plating.

The droplet-discharging method is a method for forming a predetermined pattern by discharging a droplet including a predetermined composition from a small nozzle. The ink-jet method is given as an example of the droplet-discharging method. On the other hand, the printing method includes the screen printing method, the offset printing method, and the like. When the printing method or the droplet-discharging method is employed, the antenna 542 can be formed without using a mask for an exposure. Moreover, when the printing method or the droplet-discharging method is employed, unlike the photolithography method, the material that will be etched away can be saved. Moreover, since an expensive mask for the exposure is not necessary, the cost for manufacturing the ID chip can be reduced.

In the case of using the droplet-discharging method or the printing method, for example, a conductive particle of Cu coated with Ag can be used. When the antenna 542 is formed by the droplet-discharging method, it is desirable to perform a process for improving the adhesiveness of the antenna 542 to a surface of the third interlayer insulating film 541.

There are several methods to improve the adhesiveness. One is that a metal or a metal compound that can improve the adhesiveness to a conductive film or an insulating film due to the catalyst action is attached to the surface of the third interlayer insulting film 541. Another is that an organic insulating film, a metal, or a metal compound having high adhesiveness to a conductive film or an insulating film is attached to the surface of the third interlayer insulating film 541. Another is that a plasma process is performed to the surface of the third interlayer insulating film 541 under the atmospheric pressure or reduced pressure so that the surface thereof is modified. As the metal having high adhesiveness to the conductive film or the insulating film, titanium; titanium oxide; a 3d transition element such as Sc, V, Cr, Mn, Fe, Co, Ni, Cu, or Zn; or the like is given. As the metal compound of the above-mentioned metal, an oxide, a nitride, an oxynitride, or the like is given. As the organic insulating film, for example, polyimide, a siloxane resin, or the like is given.

When the metal or the metal compound attached to the third interlayer insulating film 541 is conductive, the sheet resistance needs to be optimized so that the normal operation of the antenna is not interrupted. Specifically, the average thickness of the conductive metal or metal compound may be in the range of 1 to 10 nm. Moreover, the metal or the metal compound may be insulated partially or totally by oxidization. Furthermore, the metal or the metal compound attached to the region in which the adhesiveness is not necessary may be removed selectively by etching. The metal or the metal compound may be attached selectively only to a particular region by the droplet-discharging method, the printing method, or a sol-gel method instead of etching the metal or the metal compound after attaching the metal or the metal compound all over the substrate. The metal or the metal compound does not need to be a totally continuous film over the surface of the third interlayer insulating film 541 but may be dispersed to some extent.

Figure 7A:
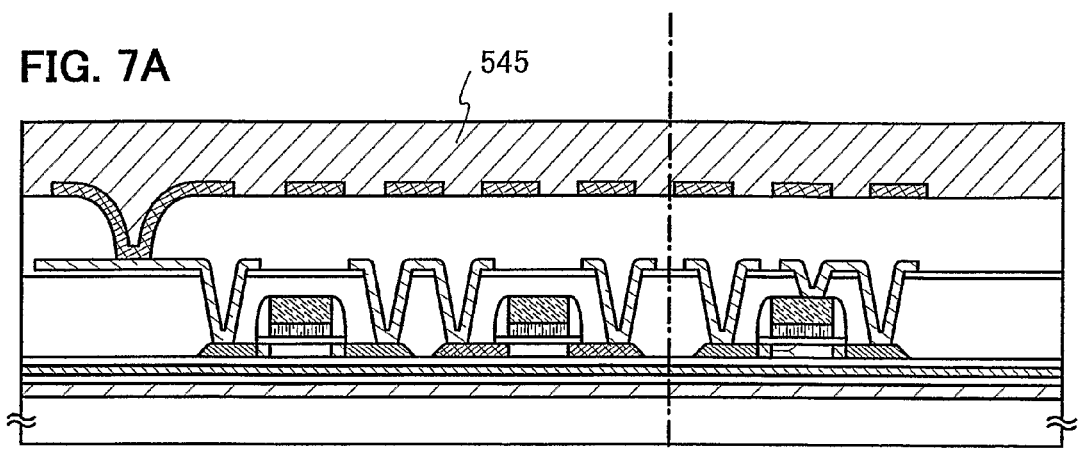
FIGS. 7A to 7C are drawings for showing a manufacturing process of the ID chip of the present invention.

Then, as shown in FIG. 7A, after forming the antenna 542, a protective layer 545 is formed over the third interlayer insulating film 541 so as to cover the antenna 542. The protective layer 545 is formed of the material that can protect the antenna 542 when etching away the stripping layer 501 afterward. For example, the protective layer 545 can be formed by applying an epoxy resin, an acrylate resin, or a silicon resin being able to dissolve in water or alcohol all over the substrate.

In this embodiment mode, the protective layer 545 is formed in such a way that a water-soluble resin (VL-WSHL10 manufactured by Toagosei Co., Ltd) is applied in 30 μm thick by spin coating, an exposure is made for 2 minutes in order to cure the resin tentatively, and then UV light is irradiated to the resin from the backside of the substrate for 2.5 minutes and from the topside of the substrate for 10 minutes, that is 12.5 minutes in total, in order to cure the resin completely. In the case where a plurality of organic resin materials are laminated, the adhesiveness may become too high or the organic resins may melt partially with the solvent to be used when being applied or baked. Therefore, when the third interlayer insulating film 541 and the protective layer 545 are formed of the organic resins that can be dissolved in the same solvent, it is preferable to form an inorganic insulating film (a $SiN_x$ film, a $SiN_xO_y$ film, an $AlN_x$ film, or an $AlN_xO_y$ film) over the third interlayer insulating film 541 so that the protective layer 545 can be removed smoothly in the following process.

Figure 7B:
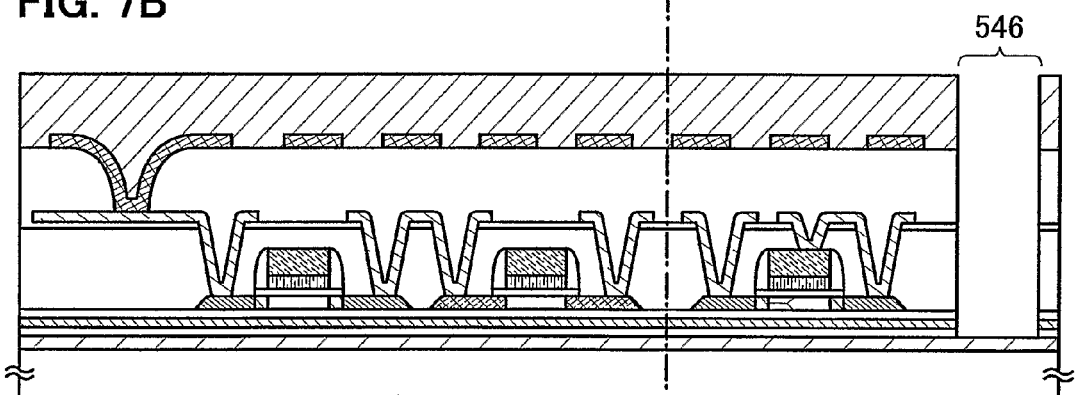

Next, as shown in FIG. 7B, a groove 546 is formed in order to divide the ID chips. The groove 546 may have the depth of such a degree that the stripping film 501 is exposed. The groove 546 can be formed by dicing or scribing the layers. It is noted that the groove 546 is not necessarily formed when it is not required to divide the ID chips formed over the first substrate.

Figure 7C:
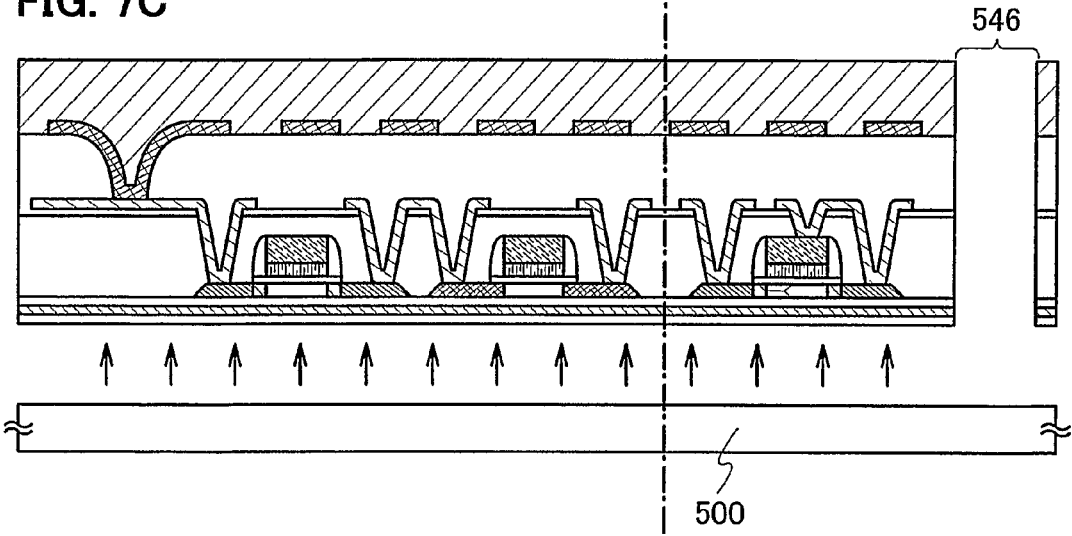

Next, as shown in FIG. 7C, the stripping layer 501 is etched away. In this embodiment mode, halogen fluoride as an etching gas is introduced from the groove 546. In this embodiment mode, $CiF_3$ (chlorine trifluoride) is used under the condition where the temperature is 350° C., the flow rate is 300 sccm, the pressure is 6 Torr, and the etching time is 3 hours. Moreover, nitrogen may be mixed into the $ClF_3$ gas. The stripping film 501 can be selectively etched by using the halogen fluoride such as $ClF_3$ so that the TFTs 530 to 532 can be stripped from the first substrate 500. The halogen fluoride may be gas or liquid.

Figure 8A:
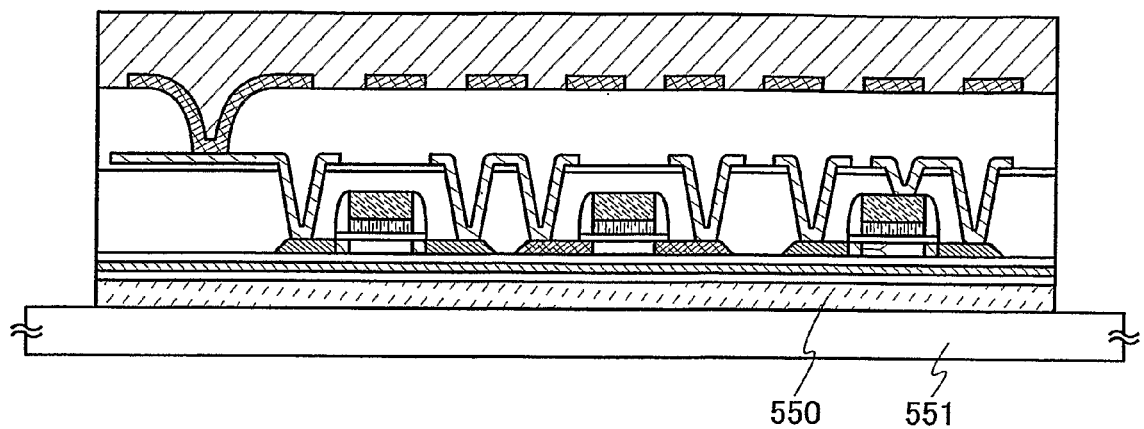
FIGS. 8A and 8B are drawings for showing a manufacturing process of the ID chip of the present invention.

Next, as shown in FIG. 8A, the stripped TFTs 530 to 532 and the antenna 542 are pasted to a second substrate 551 by using an adhesive agent 550. The adhesive agent 550 is formed of the material that can paste the second substrate 551 and the base film 502. The adhesive agent 550 may be, for example, a reactive-curing type, a thermal-curing type, a photo-curing type such as a UV-curing type, or an anaerobic type.

The second substrate 551 can be formed of a flexible organic material such as paper or plastic. Moreover, a flexible inorganic material may be used as the second substrate 551. The plastic substrate may be formed of ARTON (manufactured by JSR) including poly-norbornene that has a polar group. Moreover, polyester typified by polyethylene terephthalate (PET), polyether sulfone (PES), polyethylene naphthalate (PEN), poly carbonate (PC), nylon, polyetheretherketone (PEEK), polysulfone (PSF), polyetherimide (PEI), polyarylate (PAR), polybutylene terephthalate (PBT), polyimide, acrylonitrile-butadiene-styrene resin, polyvinyl chloride, polypropylene, polyvinyl acetate, acrylic resin, or the like can be given. It is desirable that the second substrate 551 has heat conductivity as high as approximately 2 to 30 W/mK in order to diffuse the heat generated in the integrated circuit.

Figure 8B:
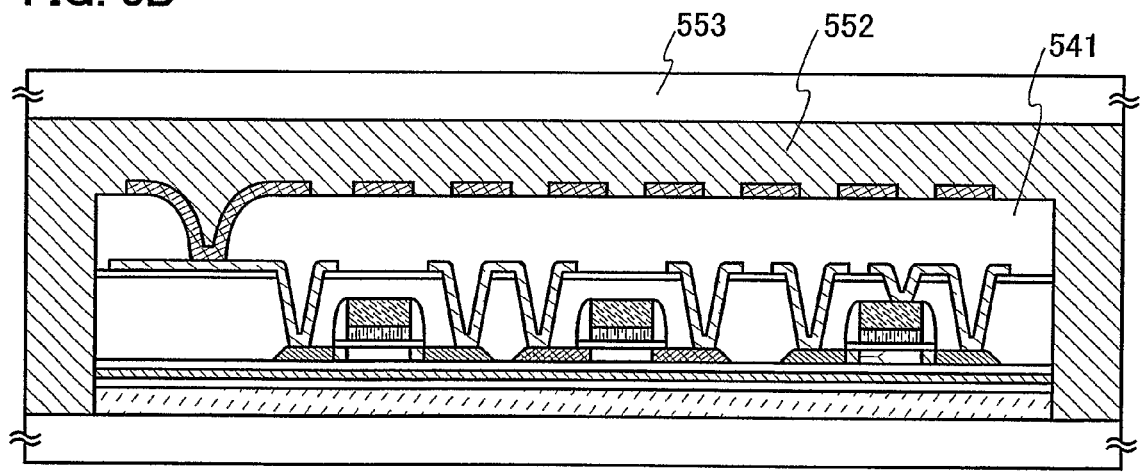

As shown in FIG. 8B, after removing the protective layer 545, an adhesive agent 552 is applied over the third interlayer insulating film 541 so as to cover the antenna 542, and then the cover member 553 is pasted. As the cover member 553, the flexible organic material such as paper or plastic can be used like the second substrate 551. The thickness of the adhesive agent 552 may range from 10 to 200 μm.

The adhesive agent 552 is formed of the material being able to paste the cover member 553 with the third interlayer insulating film 541 and the antenna 542. The adhesive agent 552 may be, for example, a reactive-curing type, a thermal-curing type, a photo-curing type such as a UV-curing type, or an anaerobic type.

According to the above-mentioned processes, the ID chip is completed. Through the above manufacturing method, an extremely thin integrated circuit having the total thickness in the range of 0.3 to 3 μm, typically about 2 μm can be formed between the second substrate 551 and the cover member 553. The thickness of the integrated circuit includes not only the thickness of the semiconductor element but also the thickness of the insulating films and the interlayer insulating films formed between the adhesive agent 550 and the adhesive agent 552. The integrated circuit in the ID chip can be made to have a length of 5 mm or less on a side (square measure of 25 mm² or less), more preferably in the range of 0.3 mm (0.09 mm²) to 4 mm (16 mm²) on a side.

The mechanical strength of the ID chip can be increased by providing the integrated circuit closer to the center between the second substrate 511 and the cover member 553. Specifically, it is desirable to control the thickness of the adhesive agents 550 and 552 so that the distance x between the second substrate 551 and the center in the direction of the thickness of the integrated circuit satisfies an inequality 1 where d is the distance between the second substrate 551 and the cover member 553.

$$\frac{1}{2}d - 30 \text{ μm} < x < \frac{1}{2}d + 30 \text{ μm} \qquad \text{Inequality 1}$$

It is more preferable to control the thickness of the adhesive agents 550 and 552 so as to satisfy an inequality 2.

$$\frac{1}{2}d - 10 \text{ μm} < x < \frac{1}{2}d + 10 \text{ μm} \qquad \text{Inequality 2}$$

Figure 19:
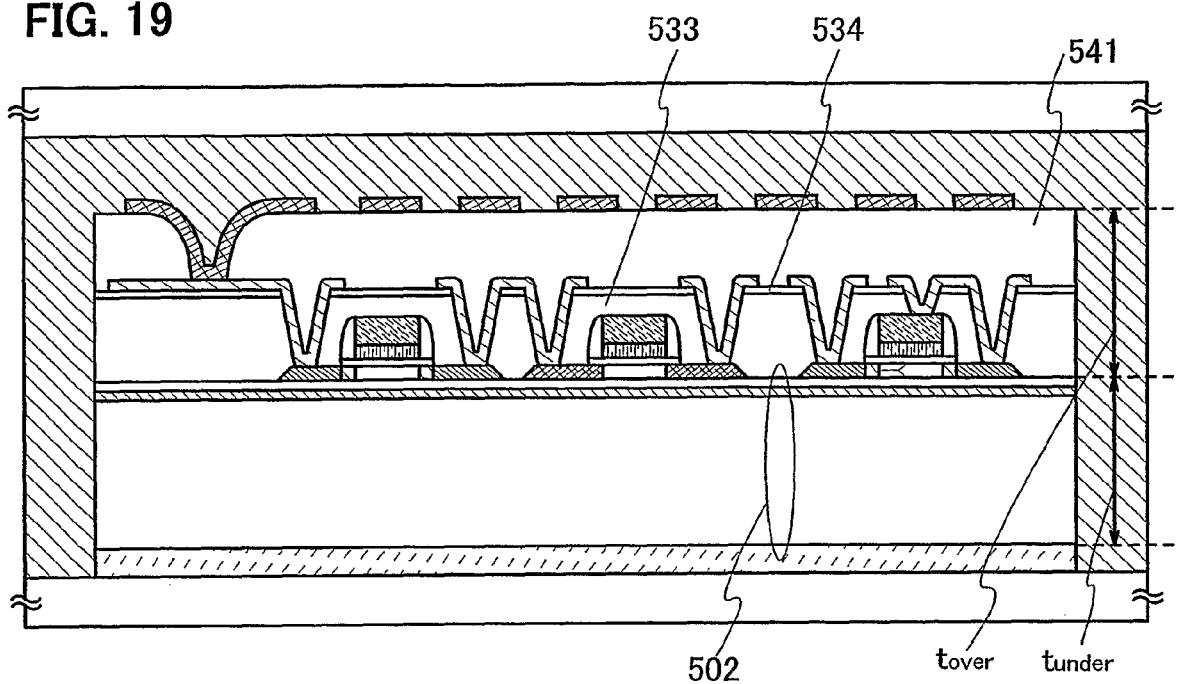
FIG. 19 is a cross-sectional view of an ID chip of the present invention.

Moreover, as shown in FIG. 19, the thickness of the base film 502, the first insulating film 533, the second interlayer insulating film 534, or the third interlayer insulating film 541 may be adjusted so that the distance ($t_{under}$) from the bottom surface of the island-shaped semiconductor film of the TFT in the integrated circuit to the bottom surface of the base layer becomes equal or approximately equal to the distance ($t_{over}$) from the bottom surface of the island-shaped semiconductor film to the top surface of the third interlayer insulating film. When the island-shaped semiconductor film is provided in the center of the integrated circuit in this way, the stress to the semiconductor layer can be relaxed, and generation of cracks can be suppressed.

Although the cover member 553 is used in FIG. 8B, the present invention is not limited to this. Only the processes up to the process shown in FIG. 8A may be performed.

Although this embodiment mode described the example in which the stripping layer is provided between the first substrate 500 having high resistance against the heat and the integrated circuit to be stripped from the first substrate through the etching, a method for manufacturing the ID chip of the present invention is not limited to this constitution. For example, a metal oxide film may be provided between the integrated circuit and the substrate having high resistance against the heat, and the metal oxide film may be weakened by crystallization so that the integrated circuit is stripped. Alternatively, the stripping layer formed of an amorphous semiconductor including hydrogen may be provided between the integrated circuit and the substrate having high resistance against the heat, and the stripping film may be removed by the laser irradiation. Alternatively, the integrated circuit may be stripped from the substrate by mechanically removing the substrate having high resistance against the heat with the integrated circuit formed thereover or by etching the substrate away while using solution or gas.

When the adhesive agent 550 in contact with the base film 502 is formed of an organic resin in order to secure the flexibility of the ID chip, the diffusion of the alkali-earth metal or the alkali metal such as Na from the organic resin into the semiconductor film can be prevented by using a silicon nitride film or a silicon nitride oxide film as the base film 502.

When an object to which an ID chip is attached has a curved surface and the second substrate 551 of the ID chip bends so as to have a curved surface drawn by moving a generating line of a conical surface, a cylindrical surface, or the like, it is desirable to conform the direction of the generating line to the direction of the TFTs 530 to 532 in which the carrier moves. With the above structure, it is possible to prevent that bending of the second substrate 551 changes the characteristics of the TFTs 530 to 532. When the proportion of the area of the island-shaped semiconductor film in the integrated circuit is 1 to 30%, it is possible to further suppress the change of the characteristics of the TFTs 530 to 532 due to the bending of the second substrate 551.

Although this embodiment mode described an example for forming the antenna over the same substrate as the integrated circuit, the present invention is not limited to this constitution. The antenna and the integrated circuit which are formed over different substrates may be pasted to each other afterward so that they are connected electrically.

The frequency of the electric wave usually applied in the ID chip is 13.56 MHz or 2.45 GHz, and it is important to form the ID chip so that these frequencies can be detected in order to enhance the versatility.

The ID chip of this embodiment mode has advantages that the electric wave is hard to be blocked compared to the ID chip formed over the semiconductor substrate and that attenuation of the signal due to the block of the electric wave can be suppressed. Since the semiconductor substrate is not necessary in the present invention, the cost for manufacturing the ID chip can be reduced drastically. For example, a silicon substrate having a diameter of 12 inch is compared with a glass substrate having a size of 730×920 mm. The silicon substrate has an area of approximately 73000 mm² while the glass substrate has an area of approximately 672000 mm². Therefore, the glass substrate is approximately 9.2 times larger than the silicon substrate. From the glass substrate having the size of approximately 672000 mm², approximately 672000 number of ID chips each of which is 1 mm square can be obtained when the area consumed by dividing the substrate is ignored. The number of ID chips is approximately 9.2 times larger than that formed using the silicon substrate. Moreover, the business investment for the mass production of the ID chip can be decreased to be ⅓ of that for manufacturing the ID chip using the silicon substrate because the number of steps can be decreased. Moreover, after stripping the integrated circuit from the glass substrate, the glass substrate can be used again. Even after considering all the costs for compensating a damaged glass substrate and washing the surface of the glass substrate, the cost can be decreased to a large degree compared with the case of using the silicon substrate. Even when the glass substrate is disposed without being reused, the cost of the glass substrate having a size of 730×920 mm² is about a half of that of the silicon substrate having a diameter of 12 inch. Therefore, it is understood that the cost for the ID chip can be reduced drastically.

As a result, when the glass substrate having a size of 730× 920 mm² is used, the price of the ID chip can be made approximately ⅓₀ of that formed over the silicon substrate having a diameter of 12 inch. Since the ID chip is expected to be used as a disposable chip, the inexpensive ID chip of the present invention is very advantageous in this application.

Although this embodiment mode described an example in which the stripped integrated circuit is pasted to the flexible substrate, the present invention is not limited to this. For example, the integrated circuit over the glass substrate may be used as an ID chip.

Embodiment 1

Figure 9:
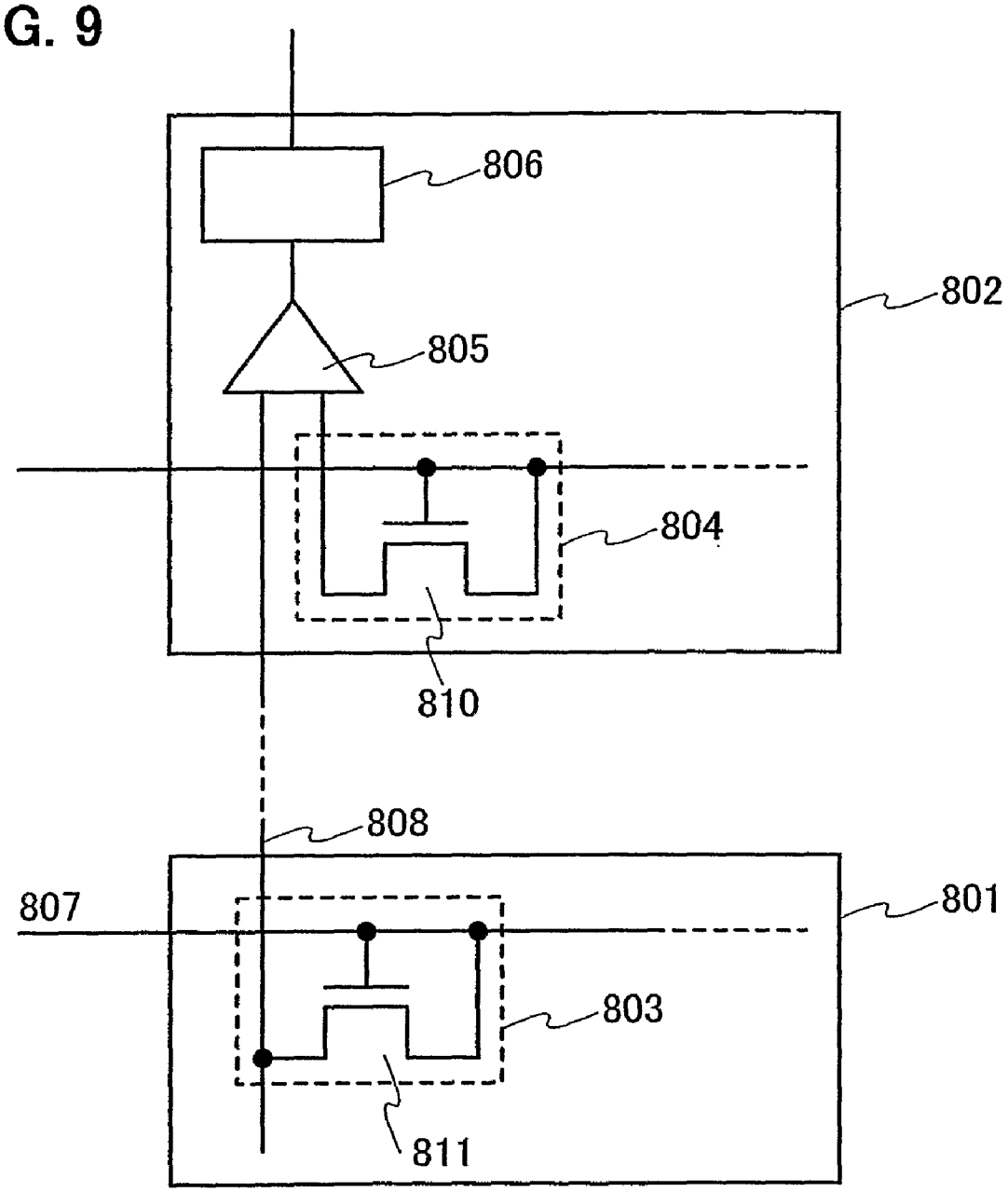
FIG. 9 is a drawing for showing structures of the memory cell array and a readout circuit in the random ROM.

This embodiment describes an example of a readout circuit used in a random ROM. FIG. 9 shows an example of the random ROM including a memory cell array 801 and a readout circuit 802. It is noted that FIG. 9 shows a memory cell 803 in the memory cell array 801 and a part of the readout circuit 802 corresponding to the memory cell 803.

The readout circuit 802 has a reference memory cell 804, a differential amplifier circuit 805, and a latch circuit 806. When a word line 807 is selected, a voltage $V_{bit}$ is supplied to the differential amplifier circuit 805 through a bit line 808 by the memory cell 803. On the other hand, the reference memory cell 804 outputs a reference voltage $V_{ref}$, which is then supplied to the differential amplifier circuit 805. The difference between the voltage $V_{bit}$ and the voltage $V_{ref}$ is amplified in the differential amplifier circuit 805 and the amplified voltage is stored in the latch circuit 806.

It is preferable that the reference voltage $V_{ref}$ is close to the average value of the voltage $V_{bit}$ of the bit line 808 supplied by a plurality of memory cells. When they are close, the plurality of memory cells in the memory cell array 801 can set the stored data to 0 or 1 with probability of approximately 1/2. For example, when a channel width of a TFT 810 in the reference memory cell 804 is made broader than a channel width of a TFT 811 in the memory cell 803, the reference voltage $V_{ref}$ can be made closer to the average value of the voltage $V_{bit}$.

Thus, one bit of data is determined based on the difference between the threshold voltage of the TFT 810 in the reference memory cell 804 and the threshold voltage of the TFT 811 in the selected memory cell 803 and is stored in the latch circuit 806. More precisely, the data are determined not only by the variation of the threshold voltages of the TFTs 811 in the memory cells 803 but also by the variation of the threshold voltages of the TFT in the differential amplifier circuit 805. Thus, the random ROM storing unique data by every ID chip can be formed by the same manufacturing process.

The above-mentioned random ROM can be manufactured by a typical manufacturing technique of a TFT and by the same process as that for manufacturing another integrated circuit. Therefore, the cost for manufacturing the random ROM can be suppressed, and the cost can be lower than the case of manufacturing a flash memory.

The probability that data stored in the random ROMs match is not always zero. However, when considering the capacity of approximately 128 bit, for example, the number of possible random digits is $2^{128}$, and therefore it can be said that the probability that data match is substantially zero.

When the data in the above-mentioned random ROM is used as the unique data of the ID chip, the photomask for manufacturing the mask ROM does not need to be disposed, and the ID chip can be manufactured at low cost.

Embodiment 2

Figure 10:
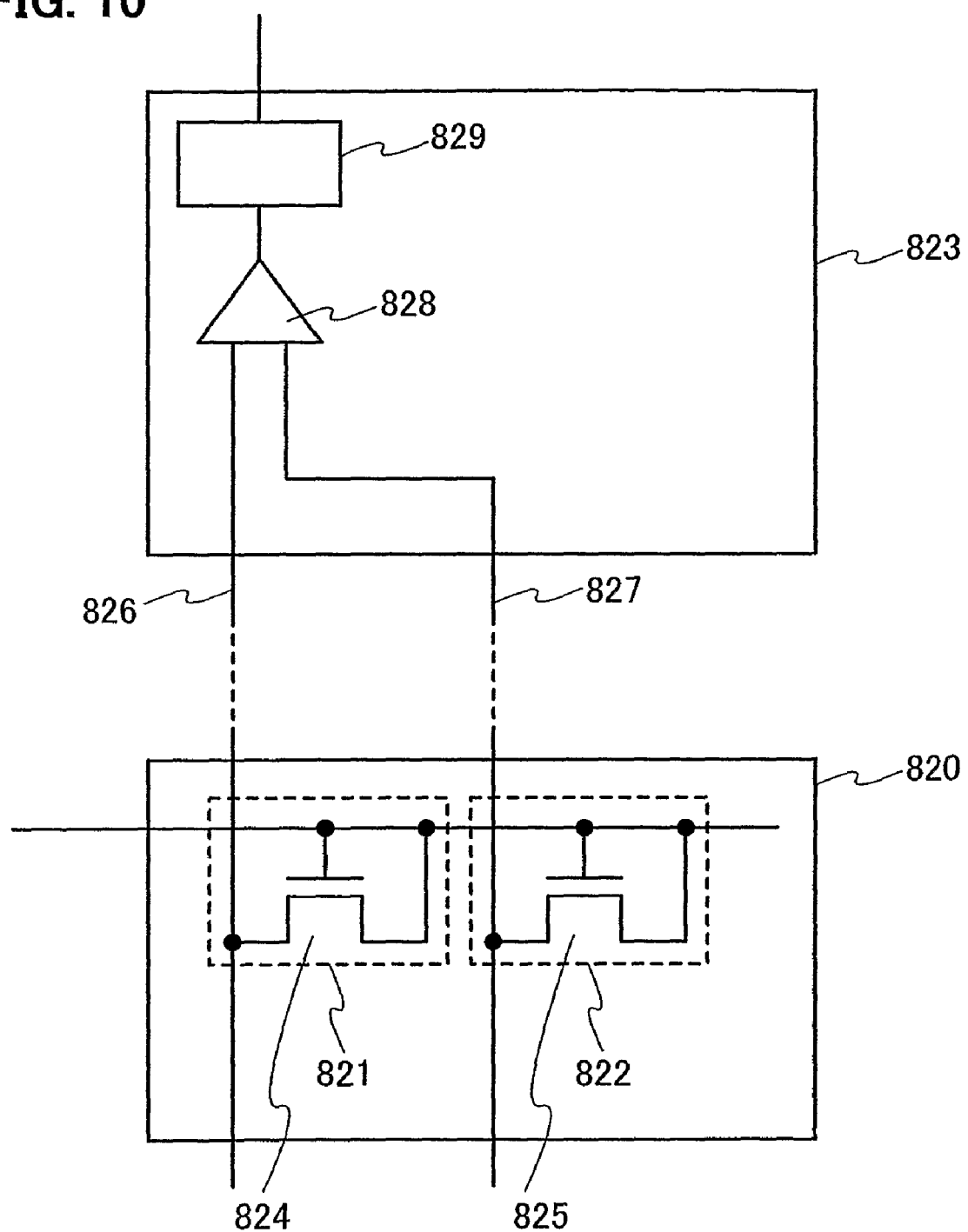
FIG. 10 is a drawing for showing structures of the memory cell array and a readout circuit in the random ROM.

With reference to FIG. 10, this embodiment describes a structure of a random ROM that is different from FIG. 9.

While FIG. 9 illustrates the random ROM for determining data by comparing each memory cell with the reference memory cell, FIG. 10 illustrates a random ROM for determining the data by comparing the voltages between the adjacent memory cells.

FIG. 10 shows two memory cells 821 and 822 in a memory cell array 820 and a part of a readout circuit 823 corresponding to the memory cells 821 and 822. When the memory cells 821 and 822 in the memory cell array 820 are selected, voltages according to threshold voltages of TFTs 824 and 825 in the memory cells 821 and 822 respectively are supplied to corresponding bit lines 826 and 827. A differential amplifier circuit 828 in the readout circuit 823 amplifies the difference between voltages of the bit lines 826 and 827, and the amplified difference between voltages is stored in a latch circuit 829 in the readout circuit 823.

The characteristics of TFTs may vary depending on not only positions of crystal grain boundaries but also other factors. For example, the factor may be distribution of the thicknesses of the gate insulating films or distribution of the density of a doped impurity element. When the characteristics of the TFTs vary by a factor except positions of crystal grain boundaries, it often happens that TFTs arranged in distant positions have various characteristics though TFTs arranged in close positions have relatively similar characteristics. In this case, the constitution of FIG. 9 is not preferable because the characteristics of the TFTs vary regularly when considering the whole memory cell array. However, in the random ROM of this embodiment, unlike the random ROM shown in FIG. 9, the memory cells to be compared are arranged adjacently. Therefore, the TFT in each memory cell is not easily affected by macro variation of the characteristics that depends on the positions of the memory cells but easily affected by the variation of the characteristics that depends on the positions of the crystal grain boundaries. As a result, the random ROM storing data with less bias of distribution of the characteristics can be obtained.

Embodiment 3

In order for an ID chip to have the data that are unique enough to be identified, the ID chip may have a random ROM that can store low-capacity data. For example, the capacity of 128 bit is enough for the random ROM to store the data for identifying the ID chip. In the case of the low-capacity random ROM, a flip-flop circuit may be used.

FIG. 11 shows an example of the random ROM in this embodiment. As shown in FIG. 11, a readout circuit 840 in the random ROM of this embodiment has a shift register 841 and a switching element 842. Moreover, the shift register 841 has a flip-flop circuit 843.

When a load signal selects the switching element 842 in the memory cell array 844 of the random ROM, data from memory cells 845 and 846 are input into the shift register 841. When the data are input from the memory cells 845 and 846 into the shift register 841, the data are output serially in accordance with a clock signal (CLK).

An operation of the shift register 841 is described in more detail. First, after the load signal is asserted, a power supply potential of the shift register 841 is earthed, and data stored in the flip-flop circuit 843 are deleted. Also, voltage depending on the variation of the threshold voltages is applied from the memory cells 845 and 846 to the flip-flop circuit 843 through the switching element 842. After that, when the load signal is deasserted, the switching element 842 is turned off to disconnect the flip-flop circuit 843 and the memory cells 845 and 846. In parallel with this, data having voltages supplied from the memory cells 845 and 846 as a default value are stored in the flip-flop circuit 843. Then, the unique data stored in the flip-flop circuit 843 are output serially by inputting the clock signal.

Although this embodiment describes an example in which one flip-flop circuit 843 corresponds to a pair of memory cells 845 and 846, the present invention is not limited to this. For example, plural pairs of memory cells may correspond to one flip-flop circuit 843. In this case, a circuit for selecting one of pairs of memory cells may be provided in the random ROM.

Embodiment 4

This embodiment describes a structure of an ID chip in which an antenna and an integrated circuit formed over different substrates are connected electrically.

Figure 12A:
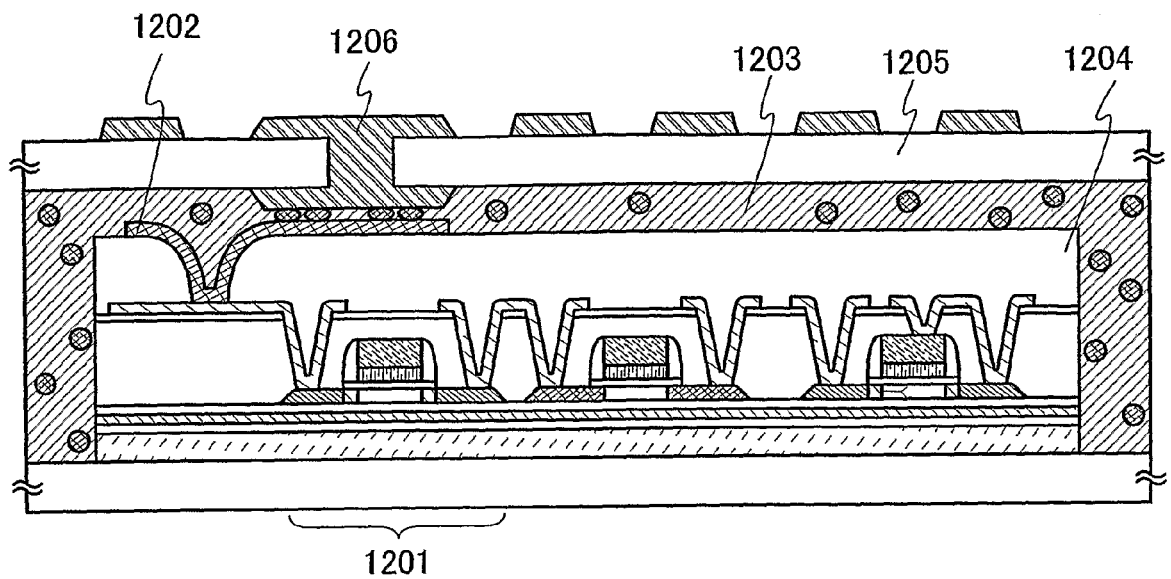
FIGS. 12A and 12B are cross-sectional views of an ID chip of the present invention.

FIG. 12A shows a cross section of the ID chip of the present embodiment. In FIG. 12A, an adhesive agent 1203 is applied over a third interlayer insulating film 1204 so as to cover a wiring 1202 connected electrically to a TFT 1201. Then, a cover member 1205 is pasted to the third interlayer insulating film 1204 by the adhesive agent 1203.

An antenna 1206 is formed to the cover member 1205. In this embodiment, the antenna 1206 and the wiring 1202 are connected electrically by using an anisotropic conductive resin as the adhesive agent 1203.

The anisotropic conductive resin is the material in which a conductive material is diffused in resin. The resin may be, for example, a thermal curable resin such as an epoxy resin, an urethane resin, or an acrylic resin; a thermoplastic resin such as a polyethylene resin or a polypropylene resin; or a siloxane resin. The conductive material may be, for example, a plastic particle such as polystyrene or epoxy that is plated by Ni or Au; a metal particle such as Ni, Au, Ag, or solder; a particle or a fiber of carbon; a fiber of Ni plated by Au; or the like. It is preferable to determine the size of the conductive material in accordance with the distance between the antenna 1206 and the wiring 1202.

The antenna 1206 and the wiring 1202 may be fixed by being pressured while applying an ultrasonic wave to the anisotropic conductive resin or while irradiating ultraviolet ray so as to cure the anisotropic conductive resin.

Although this embodiment shows the example in which the antenna 1206 and the wiring 1202 are connected electrically by the adhesive agent 1203 including the anisotropic conductive resin, the present invention is not limited to this constitution. The antenna 1206 and the wiring 1202 may be connected electrically by fixing an anisotropic conductive film while applying pressure thereto instead of the adhesive agent 1203.

Figure 12B:
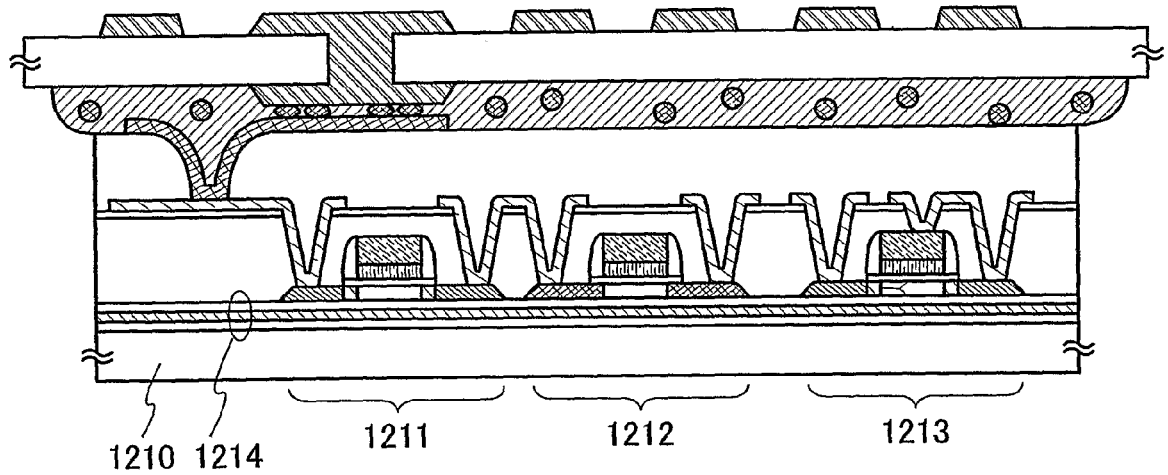

Although this embodiment described the example of the ID chip formed by pasting the stripped integrated circuit to the substrate separately provided, the present invention is not limited to this constitution. In the case that a substrate which can bear such a high temperature as in a heat treatment in the manufacturing process of the integrated circuit, it is not necessary to strip the integrated circuit from the substrate. For example, the integrated circuit over the glass substrate may be used as an ID chip. FIG. 12B is a cross-sectional view showing one example of the ID chip formed over the glass substrate.

FIG. 12B illustrates the ID chip formed over a glass substrate as the substrate 1210. The ID chip is formed so that a base film 1214 contacts the substrate 1210 and the TFTs 1211 to 1213 used in the integrated circuit without sandwiching the adhesive agent between the TFTs 1211 to 1213 and the substrate 1210.

Embodiment 5

Figure 13A:
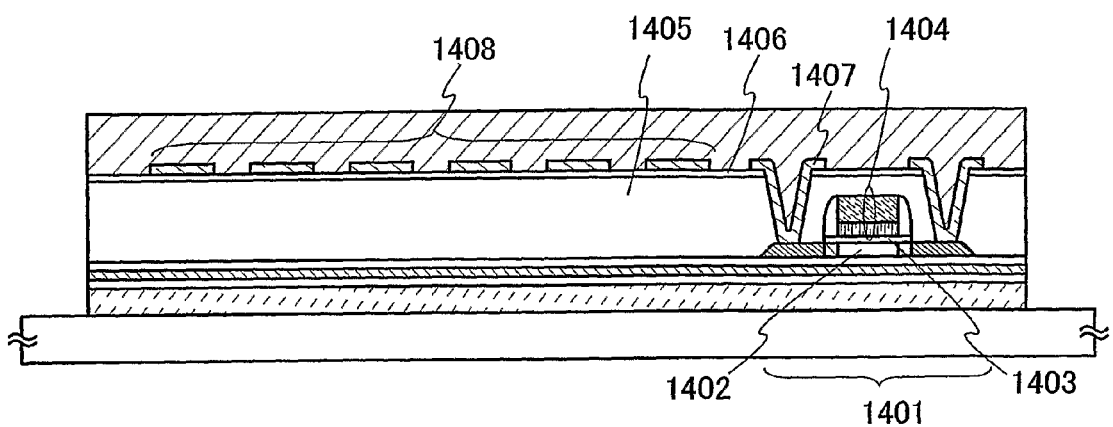
FIGS. 13A and 13B are cross-sectional views of an ID chip of the present invention.

With reference to FIG. 13A, this embodiment describes a structure of an ID chip when a wiring connected to a TFT is formed together with an antenna by patterning a conductive film. FIG. 13A is a cross-sectional view of the ID chip of the present embodiment.

In FIG. 13A, a reference numeral 1401 denotes a TFT. The TFT 1401 has an island-shaped semiconductor film 1402, a gate insulating film 1403 over the island-shaped semiconductor film 1402, and a gate electrode 1404 overlapping the island-shaped semiconductor film 1402 with the gate insulating film 1403 sandwiched therebetween. The TFT 1401 is covered by a first interlayer insulating film 1405 and a second interlayer insulating film 1406. A wiring 1407 formed over the second interlayer insulating film 1406 is connected to the island-shaped semiconductor film 1402 through a contact hole formed in the first interlayer insulating film 1405, and the second interlayer insulating film 1406.

An antenna 1408 is formed over the second interlayer insulating film 1406. The wiring 1407 and the antenna 1408 can be formed by forming and patterning a conductive film over the second interlayer insulating film 1406. The number of processes for manufacturing the ID chip can be decreased by forming the antenna 1408 together with the wiring 1407.

Figure 13B:
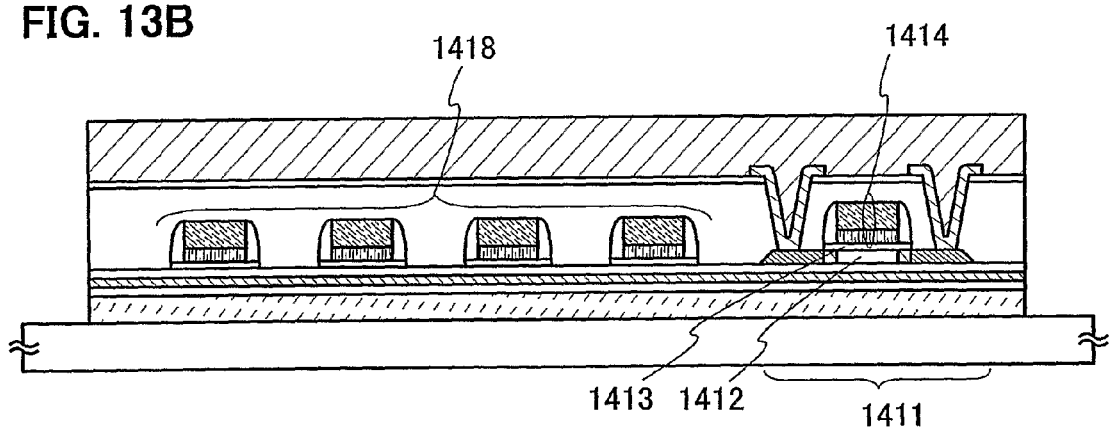

Next, a structure of another ID chip is described in which a gate electrode of a TFT is formed with an antenna by patterning a conductive film with reference to FIG. 13B. FIG. 13B is a cross-sectional view of the ID chip according to the present embodiment.

In FIG. 13B, a reference numeral 1411 denotes a TFT. The TFT 1411 has an island-shaped semiconductor film 1412, a gate insulating film 1413 overlapping the island-shaped semiconductor film 1412, and a gate electrode 1414 overlapping the island-shaped semiconductor film 1412 with the gate insulating film 1413 sandwiched therebetween. An antenna 1418 is formed over the gate insulating film 1413. The gate electrode 1414 and the antenna 1418 can be formed by forming and patterning a conductive film over the gate insulating film 1413. The number of processes for manufacturing the ID chip can be decreased by forming the antenna 1418 at the same time as the gate electrode 1414.

Although this embodiment described the example in which the integrated circuit is stripped and pasted to the substrate separately provided, the present invention is not limited to this constitution. In the case that a substrate which can bear such a high temperature as in a heat treatment in the manufacturing process of the integrated circuit, it is not necessary to strip the integrated circuit from the substrate. For example, the integrated circuit over the glass substrate may be used as an ID chip.

Embodiment 6

This embodiment describes an example of a structure of a TFT used in an ID chip of the present invention.

Figure 14A:
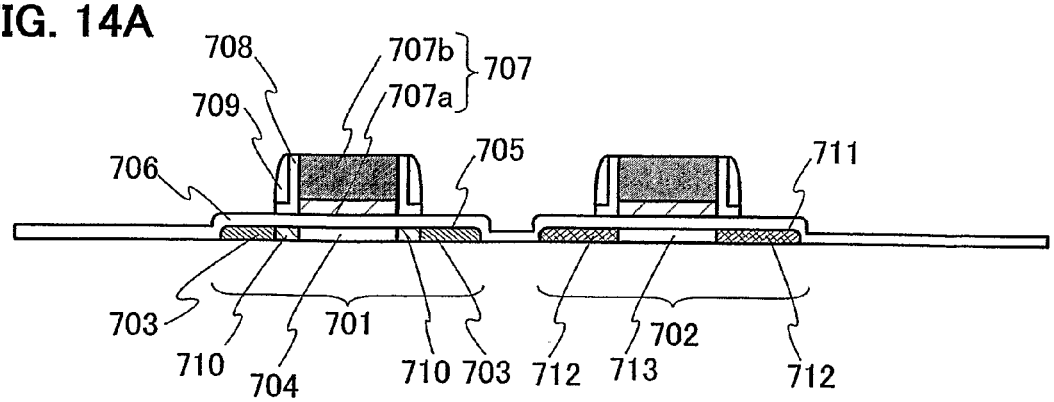
FIGS. 14A to 14C are cross-sectional views of a TFT used for an ID chip of the present invention.

FIG. 14A is a cross-sectional view of a TFT according to this embodiment. A reference numeral 701 denotes an n-channel TFT, and a reference numeral 702 denotes a p-channel TFT. The structure of the TFT is described in more detail taking the n-channel TFT 701 as an example.

The n-channel TFT 701 has an island-shaped semiconductor film 705 used as an active layer. The island-shaped semiconductor film 705 has two impurity regions 703 used as a source region and a drain region, a channel-forming region 704 sandwiched between the two impurity regions 703, and two LDD (Lightly Doped Drain) regions 710 sandwiched between the two impurity regions 703 and the channel-forming region 704. The n-channel TFT 701 has a gate insulating film 706 covering the island-shaped semiconductor film 705, a gate electrode 707, and two sidewalls 708 and 709 formed of insulating films.

Although the gate electrode 707 in this embodiment has two conductive films 707a and 707b, the present invention is not limited to this constitution. The gate electrode 707 may be formed of one conductive film or may be formed of two or more conductive films. The gate electrode 707 overlaps the channel-forming region 704 in the island-shaped semiconductor film 705 with the gate insulating film 706 sandwiched therebetween. The sidewalls 708 and 709 overlap the two LDD regions 710 in the island-shaped semiconductor film 705 with the gate insulating film 706 sandwiched therebetween.

For example, the sidewall 708 can be formed by etching a silicon oxide film having a thickness of 100 nm, and the sidewall 709 can be formed by etching an LTO (Low Temperature Oxide) film having a thickness of 200 nm. In this embodiment, the silicon oxide film used as the side wall 708 is formed by plasma CVD, and the LTO film (herein a silicon oxide film) used as the sidewall 709 is formed by reduced-pressure CVD. Although the silicon oxide film may include nitrogen, the number of nitrogen atoms shall be smaller than that of oxygen atoms.

The impurity regions 703 and the LDD regions 710 can be formed in such a way that after an n-type impurity is doped into the island-shaped semiconductor film 705 by using the gate electrode 707 as the mask, the sidewalls 708 and 709 are formed, and then an n-type impurity is doped into the island-shaped semiconductor film 705 by using the sidewalls 708 and 709 as the mask.

The p-channel TFT 702 has almost the same structure as the n-channel TFT 701 except the structure of the island-shaped semiconductor film. The island-shaped semiconductor film 711 of the p-channel TFT 702 does not have the LDD region but has two impurity regions 712 and a channel-forming region 713 sandwiched between the two impurity regions 712. And, a p-type impurity is doped in the impurity region 712. Although FIG. 14A shows an example in which the p-channel TFT 702 does not have the LDD region, the present invention is not limited to this constitution. The p-channel TFT 702 may have the LDD region.

Figure 14B:
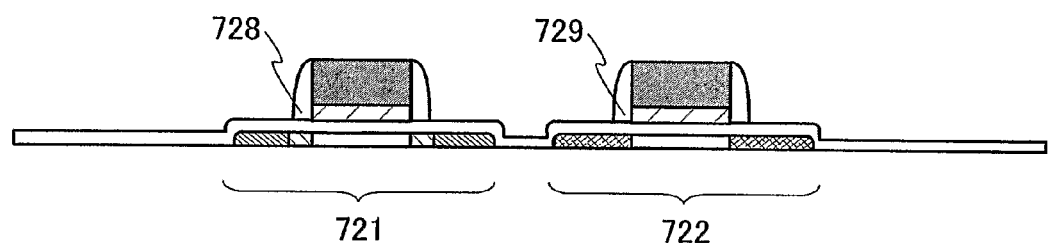

FIG. 14B shows an example in which the TFT shown in FIG. 14A has a sidewall. In FIG. 14B, an n-channel TFT 721 has a sidewall 728, and a p-channel TFT 722 has a sidewall 729. The sidewalls 728 and 729 can be formed by etching a silicon oxide film having a thickness of 100 nm, for example. In this embodiment, the silicon oxide film used as the sidewall 728 and 729 is formed by the plasma CVD method. Although the silicon oxide film may include nitrogen, the number of nitrogen atoms shall be smaller than that of oxygen atoms.

Figure 14C:
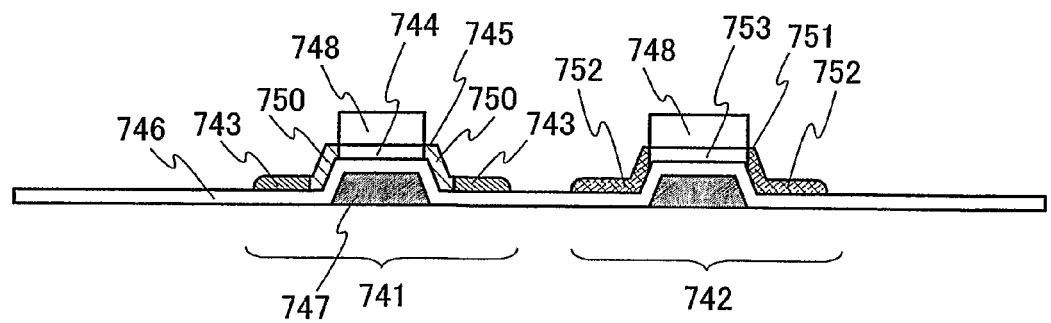

Next, FIG. 14C shows a structure of a bottom gate TFT. A reference numeral 741 denotes an n-channel TFT, and a reference numeral 742 denotes a p-channel TFT. The structure of the bottom gate TFT is described in more detail taking the n-channel TFT 741 as an example.

In FIG. 14C, the n-channel TFT 741 has an island-shaped semiconductor film 745. The island-shaped semiconductor film 745 has two impurity regions 743 used as a source region and a drain region, a channel-forming region 744 sandwiched between the two impurity regions 743, and two LDD (Lightly Doped Drain) regions 750 sandwiched between the two impurity regions 743 and the channel-forming region 744. The n-channel TFT 741 has a gate insulating film 746, a gate electrode 747, and a protective film 748 formed of an insulating film.

The gate electrode 747 overlaps the channel-forming region 744 in the island-shaped semiconductor film 745 with the gate insulating film 746 sandwiched therebetween. The gate insulating film 746 is formed after forming the gate electrode 747. The island-shaped semiconductor film 745 is formed after forming the gate insulating film 746. The protective film 748 overlaps the gate insulating film 746 with the channel-forming region 744 sandwiched therebetween.

The protective film 748 can be formed by etching a silicon oxide film having a thickness of, for example, 100 nm. In this embodiment, the silicon oxide film used as the protective film 748 is formed by plasma CVD. Although the silicon oxide film may include nitrogen, the number of nitrogen atoms shall be smaller than that of oxygen atoms.

The impurity regions 743 and the LDD regions 750 can be formed separately in the following way. The protective film 748 is formed over the semiconductor film 745 and a resist mask is formed over the protective film 748. Next, an n-type impurity is doped into the island-shaped semiconductor film 745 by using the resist mask. Then, the resist mask is removed and an n-type impurity is doped into the island-shaped semiconductor film 745 by using the protective layer 748 as the mask.

The p-channel TFT 742 has almost the same structure as the n-channel TFT 741 except the structure of the island-shaped semiconductor film. The island-shaped semiconductor film 751 does not have a LDD region but has two impurity region 752 and a channel-forming region 753 sandwiched between the two impurity regions 752. A p-type impurity is doped in the impurity region 752. Although FIG. 14A shows the example in which the p-channel TFT 742 does not have the LDD region, the present invention is not limited to this constitution. The p-channel TFT 742 may have the LDD region.

This embodiment can be freely combined with any one of the embodiments 1 to 5.

Embodiment 7

This embodiment describes a method for stripping the ID chip from the substrate and pasting it to another substrate.

Figure 15A:
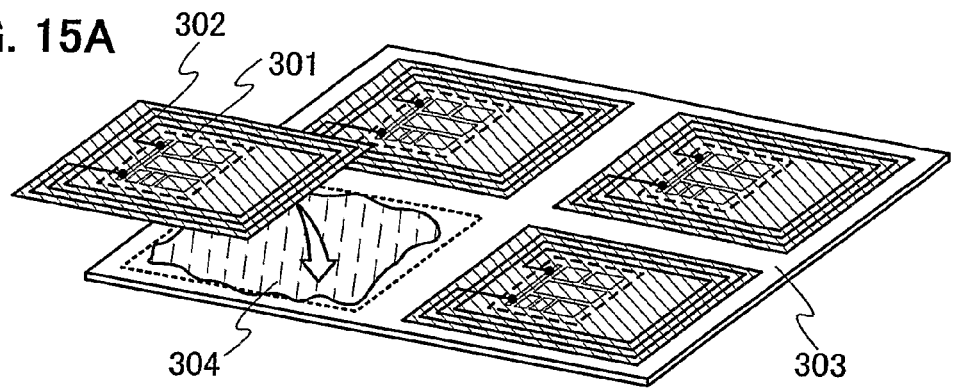
FIGS. 15A to 15D are drawings showing a method for manufacturing a plurality of ID chips of the present invention by using a large substrate.

After forming an integrated circuit 301 and an antenna 302 over a heat-resistant substrate, they are stripped from the substrate, and then they are pasted to a substrate 303 separately provided by using an adhesive agent 304 as shown in FIG. 15A. Although FIG. 15A shows the example in which a set of the integrated circuit 301 and the antenna 302 is pasted to the substrate 303 one by one, the present invention is not limited to this constitution. Plural sets of the integrated circuit 301 and the antenna 302 may be stripped and pasted simultaneously to the substrate 303 while they are connected one another.

Figure 15B:
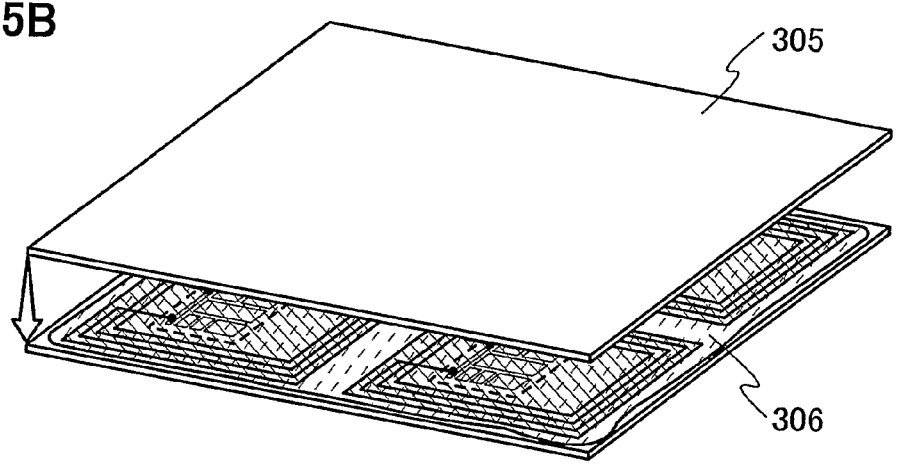
Figure 15C:
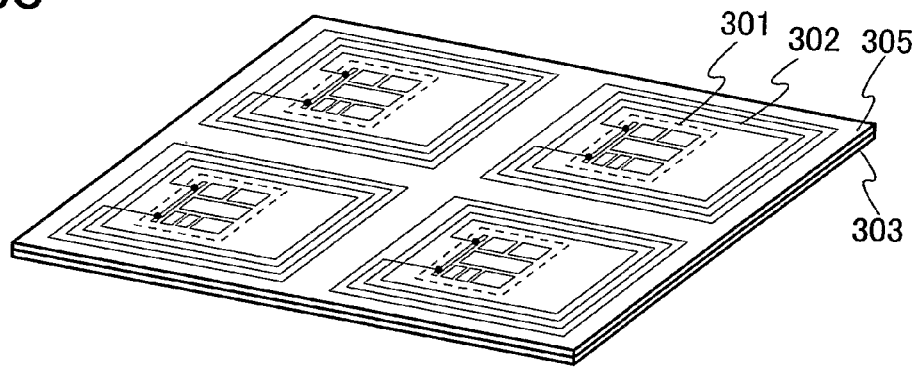

Next, as shown in FIG. 15B, a cover member 305 is pasted to the substrate 303 so as to sandwich the integrated circuit 301 and the antenna 302 therebetween. Before pasting them, an adhesive agent 306 is applied to the substrate 303 so as to cover the integrated circuit 301 and the antenna 302. By pasting the cover member 305 to the substrate 303, the state shown in FIG. 15C is obtained. In FIG. 15C, in order to clarify the positions of the integrated circuit 301 and the antenna 302, the cover member 305 is illustrated as a transparent member so that the integrated circuit 301 and the antenna 302 can be seen.

Figure 15D:
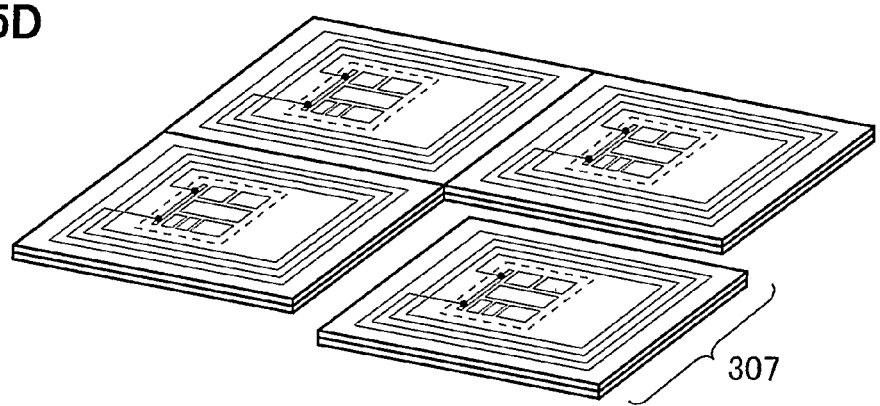

Next, as shown in FIG. 15D, an ID chip 307 is completed by dividing the plural sets of the integrated circuit 301 and the antenna 302 according to dicing or scribing.

Although the present embodiment shows the example in which the antenna 302 and the integrated circuit 301 are stripped together, the present invention is not limited to this constitution. The antenna may be formed over the substrate 303 in advance, and the integrated circuit 301 and the antenna may be connected electrically when the integrated circuit 301 is pasted to the substrate 303. Alternatively, after pasting the integrated circuit 301 to the substrate 303, the antenna may be pasted so as to connect electrically with the integrated circuit 301. Alternatively, the antenna may be formed over the cover member 305 in advance, and the integrated circuit 301 and the antenna may be connected electrically when the cover member 305 is pasted to the substrate 303.

When the substrate 303 and the cover member 305 are flexible, it is possible to use the ID chip 307 with stress applied thereto. According to the present invention, the stress applied to the ID chip 307 can be relaxed to some extent by using a stress relaxation film. When a plurality of barrier films are provided, the stress per one barrier film can be suppressed. Therefore, it is possible to prevent the characteristic of the semiconductor element from being affected adversely due to the stress or due to the diffusion of an alkali metal, an alkali-earth metal, or moisture into the semiconductor film.

It is noted that the ID chip formed over the glass substrate can be referred to as an IDG chip (Identification Glass Chip), and the ID chip formed over the flexible substrate can be referred to as an IDF chip (Identification Flexible Chip).

The present embodiment can be freely combined with any one of the embodiments 1 to 6.

Embodiment 8

Figure 16A:
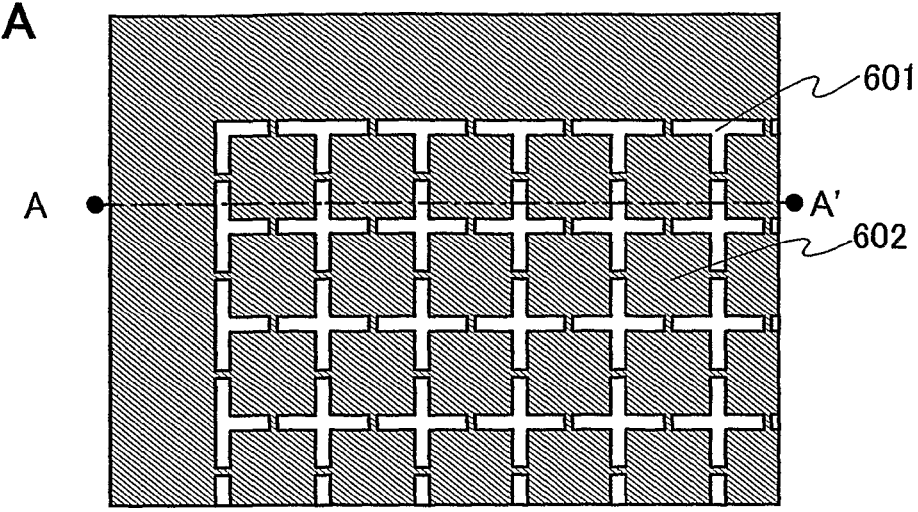
FIGS. 16A to 16D are drawings showing a shape of a groove formed when stripping a plurality of integrated circuits formed over a substrate.
Figure 16B:
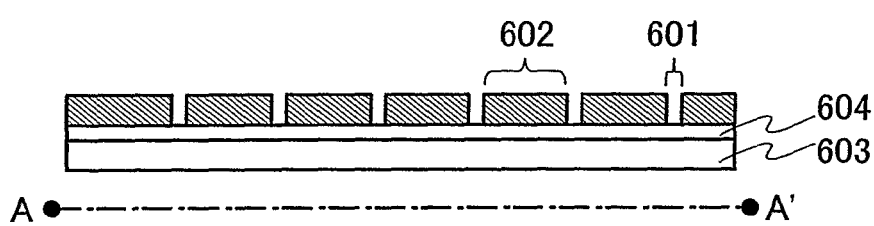

This embodiment describes a shape of a groove formed when a plurality of integrated circuits formed over a substrate are stripped. FIG. 16A is a top view of a substrate 603. FIG. 16B is a cross-sectional view thereof taken along a line of A-A' in FIG. 16A.

An integrated circuit 602 is formed over a stripping layer 604, and the stripping layer 604 is formed over the substrate 603. The groove 601 is formed between the respective integrated circuits 602 and has a depth of such a degree that the stripping layer 604 is exposed. In this present embodiment, a plurality of integrated circuits 602 are divided not totally but partially.

Figure 16C:
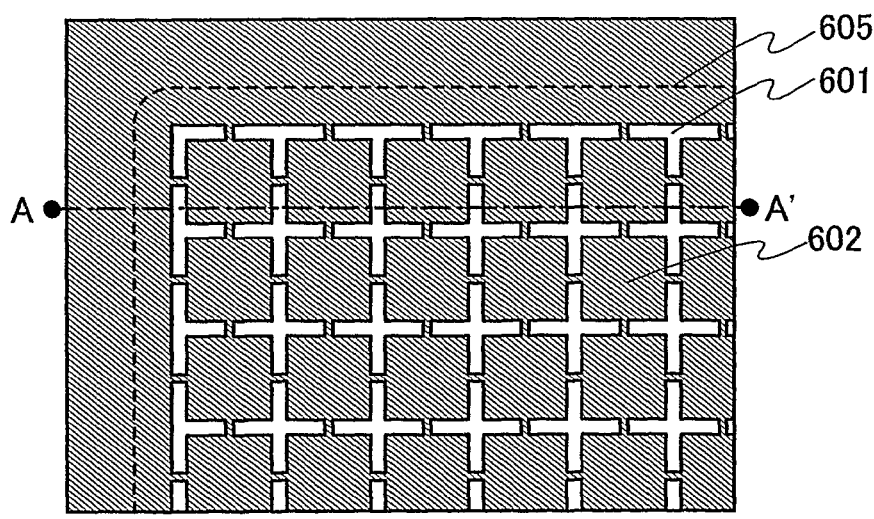
Figure 16D:
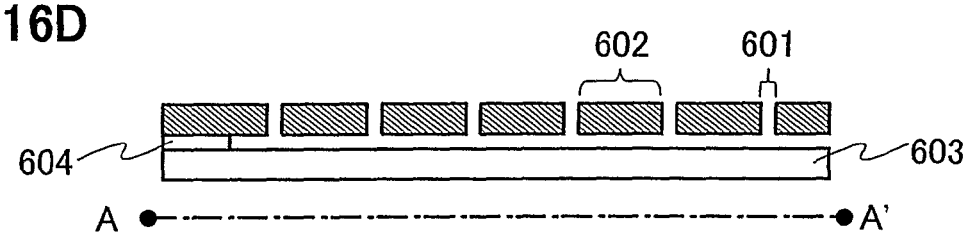

FIGS. 16C and 16D show the substrates after removing the stripping layer 604 therefrom by etching in such a way that an etching gas is flowed to the groove 601 shown in FIGS. 16A and 16B. FIG. 16C is a top view of the substrate 603, and FIG. 16D is a cross-sectional view thereof taken along A-A' in FIG. 16C. It is noted that the stripping layer 604 is etched in the range from the groove 601 to a region indicated by a dotted line 605. As shown in FIGS. 16C and 16D, the plurality of integrated circuits 602 are divided while being connected partially each other. Therefore, it is possible to prevent the plurality of integrated circuits 602 from moving due to its loss of support after the stripping layer 604 is etched away.

After the substrate 603 shown in FIGS. 16C and 16D is obtained, a tape with an adhesive agent attached is pasted to the integrated circuit 602 and stripped so that the integrated circuit 602 is stripped from the substrate 603. Then, after or before dividing the stripped integrated circuits 602, they are pasted to a substrate prepared separately.

The present embodiment shows one example of the method for manufacturing the ID chip, and the method for manufacturing the ID chip of the present invention is not limited to that shown in the present embodiment.

This embodiment can be freely combined with any one of the embodiments 1 to 7.

Embodiment 9

This embodiment describes the application of the ID chip of the present invention.

The ID chip of the present invention that is formed over a flexible substrate is suitable to be attached to a flexible object or an object having a curved surface. According to a random ROM of the ID chip of the present invention, the forgery of the object with the ID chip attached can be prevented. Moreover, it is effective to apply the ID chip of the present invention to groceries whose commercial values are much affected by a production area, a producer, and the like because the forgery of the production area, the producer, and the like can be prevented at low cost.

Specifically, the ID chip of the present invention can be attached to a tag having information of the object, for example, a docket, a price tag, a nameplate, and the like. Alternatively, the ID chip itself may be used as the tag. Furthermore, the ID chip of the present invention may be attached to certificates corresponding documents to demonstrate the truth, for example a copy of family register, a residence certificate, a passport, a license, an identification card, a membership card, a written statement of an expert opinion, a credit card, a cash card, a prepaid card, a patient registration card, a commuter pass, and the like. In addition, the ID chip may be attached to valuable securities corresponding to securities showing a property right in private law, for example a bill, a check, a carriage note, a bill of landing, a warehouse receipt, a certificate of stock, a bond, a merchandise coupon, a mortgage certificate, and the like.

Figure 17A:
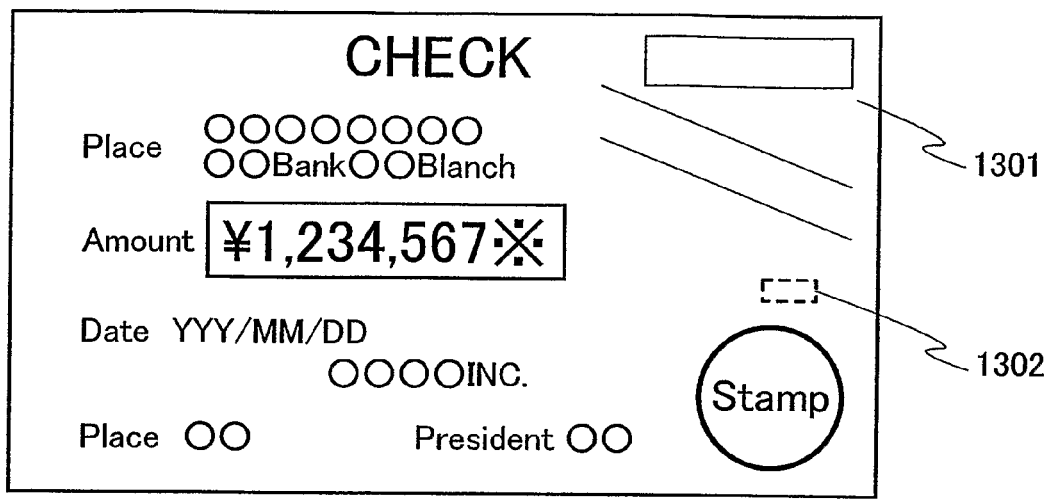
FIGS. 17A to 17C are drawings for showing applications of an ID chip of the present invention.

FIG. 17A shows an example of a check 1301 with an ID chip 1302 of the present invention mounted. Although the ID chip 1302 is mounted inside the check 1301 in FIG. 17A, the ID chip 1302 may be exposed to the outside.

Figure 17B:
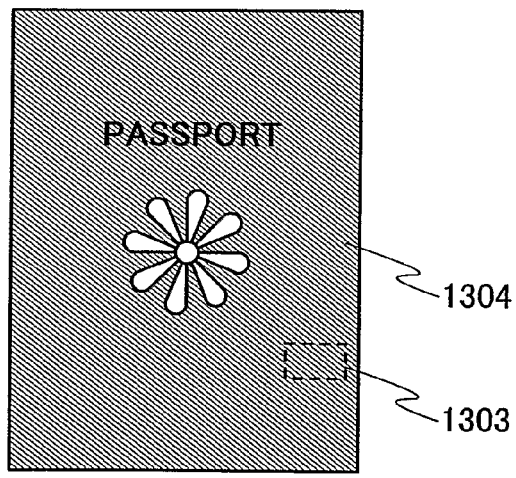

FIG. 17B shows an example of a passport 1304 with an ID chip 1303 of the present invention mounted. Although the ID chip 1303 is attached to a top surface of the passport 1304, the ID chip 1303 may be attached to another page in the passport 1304.

Figure 17C:
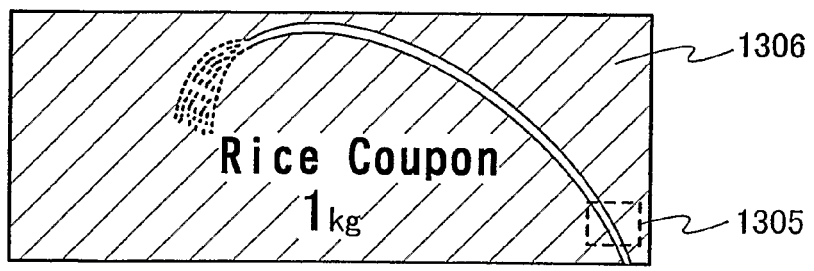

FIG. 17C shows an example of a merchandise coupon 1306 with an ID chip 1305 of the present invention mounted. The ID chip 1305 may be mounted inside the merchandise coupon 1306 or may be exposed to the surface thereof.

Since the ID chip formed by using the integrated circuit having the TFT is inexpensive and thin, the ID chip of the present invention is suitable for the application in which the ID chip is disposed finally by consumers. Particularly in the case of using the ID chip to merchandise in which only a small amount of money of several yen to several tens of yen greatly affects its total sales, a packaging material having the ID chip of the present invention that is inexpensive and thin is very advantageous. The packaging material may be, for example, a shaped or shapeable support medium for packaging an object such as a plastic wrap, a plastic bottle, a tray, or a capsule.

Figure 18A:
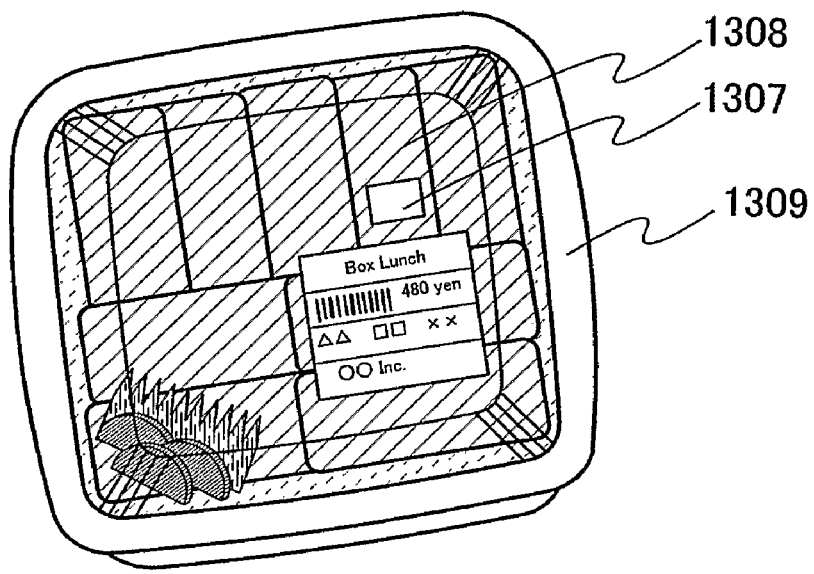
FIGS. 18A and 18B are drawings for showing applications of an ID chip of the present invention.

FIG. 18A shows an example in which a lunch box 1309 for sale is wrapped by using a packaging material 1308 with an ID chip 1307 of the present invention mounted. When a price and the like of the lunch box are recorded in the ID chip 1307, account of the lunch box 1309 can be settled by a register serving as a reader/writer.

As another example, the ID chip of the present invention may be mounted to a label of a product so that the distribution of products can be controlled by using the ID chip.

Figure 18B:
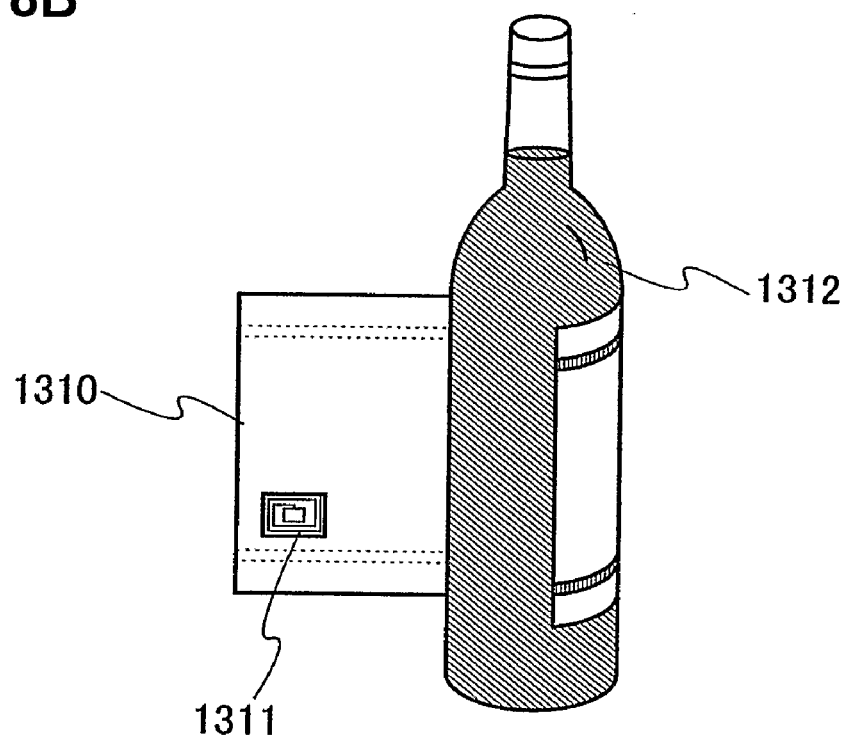

As shown in FIG. 18B, an ID chip 1311 of the present invention is mounted to a support medium such as a label 1310 of a product whose rear surface is adhesive. Then, the label 1310 with the ID chip 1311 mounted is pasted to a product 1312. Identification information of the product 1312 can be read wirelessly from the ID chip 1311 mounted to the label 1310. Thus, the ID chip 1311 makes it possible to control the product easily through the distribution of the products.

When a memory of the integrated circuit in the ID chip 1311 is a nonvolatile memory in which writing is possible, a distribution process of the product 1312 can be recorded. Moreover, when a process of producing the product is recorded in the ID chip 1311, a dealer, a retailer, and a consumer can easily know a production area, a producer, a date of manufacture, a processing method, and the like.

This embodiment can be freely combined with any one of the embodiments 1 to 8.

EXPLANATION OF REFERENCE

101: BEAM SPOT, 102: REGION, 103: REGION, 104: ACTIVE LAYER, 105: ACTIVE LAYER, 201: DECODER. 202 MEMORY CELL ARRAY, 203: CIRCUIT, 204: MEMORY CELL, 205: WORD LINE, 206: BIT LINE, 207: TFT, 301: INTEGRATED CIRCUIT, 302 ANTENNA, 303: SUBSTRATE, 304: ADHESIVE AGENT, 305: COVER MEMBER, 306: ADHESIVE AGENT, 307: ID CHIP, 401: REGION, 402: REGION, 403: CIRCUIT, 404: CIRCUIT, 405: DECODER, 406: MEMORY CELL ARRAY, 500: SUBSTRATE, 501: STRIPPING LAYER, 502: BASE FILM, 503: SEMICONDUCTOR FILM, 504: REGION, 505: REGION, 506: SEMICONDUCTOR FILM, 507: SEMICONDUCTOR FILM, 508: SEMICONDUCTOR FILM, 509: GATE INSULATING FILM, 510: GATE ELECTRODE, 511: GATE ELECTRODE, 512: GATE ELECTRODE, 513: RESIST, 515: RESIST, 516: LOW-DENSITY IMPURITY REGION, 518: RESIST, 520: HIGH-DENSITY IMPURITY REGION, 521: INSULATING FILM, 522: SIDE WALL, 526: RESIST, 527: HIGH-DENSITY IMPURITY REGION, 528: HIGH-DENSITY IMPURITY REGION, 530: N-CHANNEL TFT, 531: P-CHANNEL TFT, 532: N-CHANNEL TFT, 533: INTERLAYER INSULATING FILM, 534: INTERLAYER INSULATING FILM, 535: WIRING, 536: WIRING, 538: WIRING, 539: WIRING, 541: INTERLAYER INSULATING FILM, 542: ANTENNA, 545: PROTECTIVE LAYER, 546: GROOVE, 550: ADHESIVE AGENT, 551: SUBSTRATE, 552: ADHESIVE AGENT, 553: COVER MEMBER, 601: GROOVE, 602: INTEGRATED CIRCUIT, 603: SUBSTRATE, 604: STRIPPING LAYER, 605: DOTTED LINE, 701: N-CHANNEL TFT, 702: P-CHANNEL TFT, 703: IMPURITY REGION, 704: CHANNEL-FORMING REGION, 705: SEMICONDUCTOR FILM, 706: GATE INSULATING FILM, 707: GATE ELECTRODE, 707*a*: CONDUCTIVE FILM, 707*b*: CONDUCTIVE FILM, 708: SIDEWALL, 709: SIDEWALL, 710: LDD (LIGHTLY DOPED DRAIN) REGION, 711: SEMICONDUCTOR FILM, 712: IMPURITY REGION, 713: CHANNEL-FORMING REGION, 721: N-CHANNEL TFT, 722: P-CHANNEL TFT, 728: SIDEWALL, 741: N-CHANNEL TFT, 742: P-CHANNEL TFT, 743: IMPURITY REGION, 744: CHANNEL-FORMING REGION, 745: SEMICONDUCTOR FILM, 746: GATE INSULATING FILM, 747: GATE ELECTRODE, 748: PROTECTIVE FILM, 750: LDD (LIGHTLY DOPED DRAIN) REGION, 751: SEMICONDUCTOR FILM, 752: IMPURITY REGION, 753: CHANNEL-FORMING REGION, 801: MEMORY CELL ARRAY, 802: CIRCUIT, 803: MEMORY CELL, 804: REFERENCE MEMORY CELL, 805: DIFFERENTIAL AMPLIFIER CIRCUIT, 806: LATCH CIRCUIT, 807: WORD LINE, 808: BIT LINE, 810: TFT, 811: TFT, 820: MEMORY CELL ARRAY, 821: MEMORY CELL, 823: CIRCUIT, 824: TFT, 826: BIT LINE, 828: DIFFERENTIAL AMPLIFIER CIRCUIT, 829: LATCH CIRCUIT, 840: CIRCUIT, 841: SHIFT REGISTER, 842: SWITCHING ELEMENT, 843: FLIP-FLOP CIRCUIT, 844: MEMORY CELL ARRAY, 845: MEMORY CELL, 900: ANTENNA, 901: INTEGRATED CIRCUIT, 902: ANTENNA COIL, 903: CAPACITOR ELEMENT, 904: MODULATOR CIRCUIT, 905: RECTIFIER CIRCUIT, 906: MICROPROCESSOR, 907: MEMORY, 908: SWITCH, 909: DEMODULATOR CIRCUIT, 910: RANDOM ROM, 1201: TFT, 1202: WIRING 1203: ADHESIVE AGENT, 1204: INTERLAYER INSULATING FILM, 1205: COVER MEMBER, 1206: ANTENNA, 1210: SUBSTRATE, 1211: TFT, 1214: BASE FILM, 1301: CHECK, 1302; ID CHIP, 1303: ID CHIP, 1304: PASS PORT, 1305: ID CHIP, 1306: MERCHANDISE COUPON, 1307: ID CHIP, 1308: PACKAGING MATERIAL, 1309: LUNCH BOX, 1310: LABEL, 1311: ID CHIP, 1312: PRODUCT, 1401: TFT, 1402: SEMICONDUCTOR FILM, 1403: GATE INSULATING FILM, 1404: GATE ELECTRODE, 1405: INTERLAYER INSULATING FILM, 1406: INTERLAYER INSULATING FILM, 1407: WIRING, 1408: ANTENNA, 1411: TFT, 1412: SEMICONDUCTOR FILM, 1413: GATE INSULATING FILM, 1414: GATE ELECTRODE, and 1418: ANTENNA.

The invention claimed is:

1. A method for manufacturing a semiconductor device, comprising the steps of:
    forming a semiconductor film having an amorphous structure over a first substrate;
    irradiating the semiconductor film with a laser beam with scanning in a direction, thereby forming a first region and a second region in the semiconductor film;
    forming an integrated circuit comprising a first thin film transistor using the first region in the semiconductor film and a memory cell array comprising a second thin film transistor using the second region in the semiconductor film; and
    forming an antenna,
    wherein the first region is superior to the second region in crystallinity,
    wherein the step of forming the integrated circuit and the memory cell array comprises a process of forming a gate electrode, and
    wherein the step of forming the antenna is performed at the same time as the process of forming the gate electrode.

2. A method for manufacturing a semiconductor device according to claim 1, wherein the integrated circuit comprises:
    a memory cell;
    a microprocessor; and
    at least one of a connection terminal, a rectifier circuit, a demodulator circuit and a modulator circuit.

3. A method for manufacturing a semiconductor device according to claim 1,
    wherein the second thin film transistor comprises a source region and a drain region, and
    wherein the gate electrode is electrically connected to one of the source region and the drain region.

4. A method for manufacturing a semiconductor device according to claim 1,
wherein the laser beam is a continuous wave laser beam, and
wherein the first region includes a crystal grain grown continuously in the direction of scanning the continuous wave laser beam.

5. A method for manufacturing a semiconductor device according to claim 1,
wherein an active layer of the first thin film transistor is arranged so that the direction of scanning the laser beam conforms to a direction in which an electric carrier moves in the active layer when electric current is flown in the first thin film transistor.

6. A method for manufacturing a semiconductor device according to claim 1,
wherein the first substrate is selected from the group consisting of a glass substrate, a quartz substrate, a ceramic substrate and a metal substrate.

7. A method for manufacturing a semiconductor device, comprising the steps of:
forming a semiconductor film having an amorphous structure over a first substrate;
irradiating the semiconductor film with a laser beam with scanning in a direction, thereby forming a first region and a second region in the semiconductor film;
forming an integrated circuit comprising a first thin film transistor using the first region in the semiconductor film and a memory cell array comprising a second thin film transistor using the second region in the semiconductor film; and
forming an antenna,
wherein the first region is superior to the second region in crystallinity,
wherein the step of forming the integrated circuit and the memory cell array comprises a process of forming one of a source electrode and a drain electrode, and
wherein the step of forming the antenna is performed at the same time as the process of forming the one of the source electrode and the drain electrode.

8. A method for manufacturing a semiconductor device according to claim 7, wherein the integrated circuit comprises:
a memory cell;
a microprocessor; and
at least one of a connection terminal, a rectifier circuit, a demodulator circuit and a modulator circuit.

9. A method for manufacturing a semiconductor device according to claim 7,
wherein the second thin film transistor comprises a gate electrode, a source region and a drain region, and
wherein the gate electrode is electrically connected to one of the source region and the drain region.

10. A method for manufacturing a semiconductor device according to claim 7,
wherein the laser beam is a continuous wave laser beam, and
wherein the first region includes a crystal grain grown continuously in the direction of scanning the continuous wave laser beam.

11. A method for manufacturing a semiconductor device according to claim 7,
wherein an active layer of the first thin film transistor is arranged so that the direction of scanning the laser beam conforms to a direction in which an electric carrier moves in the active layer when electric current is flown in the first thin film transistor.

12. A method for manufacturing a semiconductor device according to claim 7,
wherein the first substrate is selected from the group consisting of a glass substrate, a quartz substrate, a ceramic substrate and a metal substrate.

13. A method for manufacturing a semiconductor device, comprising the steps of:
forming a semiconductor film having an amorphous structure over a first substrate;
irradiating the semiconductor film with a laser beam with scanning in a direction, thereby forming a first region and a second region in the semiconductor film;
forming an integrated circuit comprising a first thin film transistor using the first region in the semiconductor film and a memory cell array comprising a second thin film transistor using the second region in the semiconductor film;
forming an antenna over a second substrate; and
attaching the first substrate to the second substrate so as to sandwich the integrated circuit, the memory cell array and the antenna between the first substrate and the second substrate,
wherein the first region is superior to the second region in crystallinity.

14. A method for manufacturing a semiconductor device according to claim 13, wherein the integrated circuit comprises:
a memory cell;
a microprocessor; and
at least one of a connection terminal, a rectifier circuit, a demodulator circuit and a modulator circuit.

15. A method for manufacturing a semiconductor device according to claim 13,
wherein the second thin film transistor comprises a gate electrode, a source region and a drain region, and
wherein the gate electrode is electrically connected to one of the source region and the drain region.

16. A method for manufacturing a semiconductor device according to claim 13,
wherein the laser beam is a continuous wave laser beam, and
wherein the first region includes a crystal grain grown continuously in the direction of scanning the continuous wave laser beam.

17. A method for manufacturing a semiconductor device according to claim 13,
wherein an active layer of the first thin film transistor is arranged so that the direction of scanning the laser beam conforms to a direction in which an electric carrier moves in the active layer when electric current is flown in the first thin film transistor.

18. A method for manufacturing a semiconductor device according to claim 13,
wherein the first substrate is selected from the group consisting of a glass substrate, a quartz substrate, a ceramic substrate and a metal substrate.

19. A method for manufacturing a semiconductor device, comprising the steps of:
forming a semiconductor film having an amorphous structure over a first substrate;
irradiating the semiconductor film with a laser beam with scanning in a direction, thereby forming a first region and a second region in the semiconductor film;
forming an integrated circuit comprising a first thin film transistor using the first region in the semiconductor film and a memory cell array comprising a second thin film transistor using the second region in the semiconductor film;

forming a base film over the first substrate before forming the semiconductor film;

forming a stripping layer over the base film before forming the semiconductor film;

stripping the integrated circuit and the memory cell array from the first substrate; and attaching the stripped integrated circuit and the memory cell array to a second substrate, wherein the first region is superior to the second region in crystallinity.

20. A method for manufacturing a semiconductor device according to claim 19, wherein the integrated circuit comprises:
   a memory cell;
   a microprocessor; and
   at least one of a connection terminal, a rectifier circuit, a demodulator circuit and a modulator circuit.

21. A method for manufacturing a semiconductor device according to claim 19,
   wherein the second thin film transistor comprises a gate electrode, a source region and a drain region, and
   wherein the gate electrode is electrically connected to one of the source region and the drain region.

22. A method for manufacturing a semiconductor device according to claim 19,
   wherein the laser beam is a continuous wave laser beam, and
   wherein the first region includes a crystal grain grown continuously in the direction of scanning the continuous wave laser beam.

23. A method for manufacturing a semiconductor device according to claim 19,
   wherein an active layer of the first thin film transistor is arranged so that the direction of scanning the laser beam conforms to a direction in which an electric carrier moves in the active layer when electric current is flown in the first thin film transistor.

24. A method for manufacturing a semiconductor device according to claim 19,
   wherein the first substrate is selected from the group consisting of a glass substrate, a quartz substrate, a ceramic substrate and a metal substrate.

25. A method for manufacturing a semiconductor device according to claim 19,
   wherein the second substrate is flexible and selected from the group consisting of a paper substrate and a plastic substrate.

26. A method for manufacturing a semiconductor device according to claim 19,
   wherein the step of stripping the integrated circuit and the memory cell array from the first substrate comprises the steps of:
   forming a groove in a peripheral region of the integrated circuit and the memory cell array so as to expose the base film through the stripping layer; and
   flowing an etching gas into the groove, thereby removing the stripping layer.

* * * * *